United States Patent
Lin et al.

(10) Patent No.: US 9,130,517 B2
(45) Date of Patent: Sep. 8, 2015

(54) SYSTEMS AND METHODS OF HARMONIC EXTRACTION AND REJECTION

(71) Applicant: QUALCOMM Incorporated, San Diego, CA (US)

(72) Inventors: Saihua Lin, Santa Clara, CA (US); Roger Brockenbrough, Santa Clara, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 13/646,467

(22) Filed: Oct. 5, 2012

(65) Prior Publication Data
US 2014/0097874 A1 Apr. 10, 2014

(51) Int. Cl.
H03K 5/13 (2014.01)
H03F 1/32 (2006.01)
H03F 3/60 (2006.01)

(52) U.S. Cl.
CPC .............. *H03F 1/3252* (2013.01); *H03F 3/602* (2013.01); *H03F 2200/192* (2013.01)

(58) Field of Classification Search
USPC ........................................................ 327/231
See application file for complete search history.

(56) References Cited

U.S. PATENT DOCUMENTS

| | | | |
|---|---|---|---|
| 4,618,831 A * | 10/1986 | Egami et al. | 330/124 R |
| 4,835,493 A | 5/1989 | Walsh, Jr. | |
| 4,926,136 A | 5/1990 | Olver | |
| 5,963,858 A * | 10/1999 | Seely | 455/326 |
| 6,268,768 B1 | 7/2001 | Blodgett | |
| 6,725,029 B1 | 4/2004 | Allen | |
| 6,738,611 B1 | 5/2004 | Politi | |
| 7,256,649 B2 | 8/2007 | Ksienski et al. | |
| 7,746,169 B2 | 6/2010 | Deng et al. | |
| 7,894,790 B2 | 2/2011 | Gomez et al. | |
| 7,944,298 B2 | 5/2011 | Cabanillas et al. | |
| 8,086,207 B2 | 12/2011 | Muthali et al. | |
| 8,565,103 B2 * | 10/2013 | Santhanam | 370/252 |
| 2006/0181344 A1 | 8/2006 | Ksienski et al. | |
| 2009/0108930 A1 | 4/2009 | Gandhi et al. | |

(Continued)

FOREIGN PATENT DOCUMENTS

EP 1102394 A2 5/2001

OTHER PUBLICATIONS

"Low Cost Very High IP3 Low Noise Amplifiers Cover 250MHz to 2300MHz" Mini-Circuits, Aug. 5, 2002, 7 pp.
"Balanced Amplifier IP3 & P1db Improvement Due to 90 Degree Hybrid Couplers" by Thomas Shafer, RF Cafe www.rfcafe.com/references/electrical/balanced-amplifier-ip3-improvement.htm viewed Jul. 25, 2012, 2 pp.

(Continued)

*Primary Examiner* — Lincoln Donovan
*Assistant Examiner* — Patrick Chen
(74) *Attorney, Agent, or Firm* — Peter A. Clevenger

(57) ABSTRACT

A device includes a first hybrid, where a first input of the first hybrid is coupled to an output of a first amplifier configured to receive a first input signal. A first input of a second hybrid is coupled to an output of a second amplifier configured to receive a second input signal. The device includes a first phase shifter configured to receive the first input signal and a second phase shifter configured to receive the second input signal. An output of the first phase shifter is coupled to an input of a third amplifier, and an output of the third amplifier is coupled to a second input of the second hybrid. An output of the second phase shifter is coupled to an input of a fourth amplifier, and an output of the fourth amplifier is coupled to a second input of the first hybrid.

43 Claims, 7 Drawing Sheets

(56) References Cited

U.S. PATENT DOCUMENTS

2010/0329158 A1 12/2010 Sengupta et al.
2011/0115559 A1* 5/2011 Amrutur et al. .............. 330/149

OTHER PUBLICATIONS

International Search Report and Written Opinion—PCT/US2013/063279—ISA/EPO—Jan. 22, 2014.

* cited by examiner

SYSTEMS AND METHODS OF HARMONIC EXTRACTION AND REJECTION

I. FIELD

The present disclosure is generally related to harmonic extraction and rejection.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Portable wireless telephones may also transmit and/or receive signals that have wavelengths in the range of one millimeter to ten millimeters (i.e., millimeter-wave range). Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Computing devices, such as wireless telephones, may use a signal that has a particular frequency. For example, signals having certain frequencies may be used during signal processing (e.g., encoding, decoding, modulating, demodulating, etc.) operations. The computing device may also use a signal that has a suppressed frequency component. Various methods may be implemented by the computing device to generate signals. For example, a method of generating a signal that has a particular frequency may involve extracting a particular harmonic component of another signal. As another example, a method of generating a signal that has a suppressed frequency component may involve rejecting a particular frequency component of another signal.

Conventional filtering approaches may be challenging and expensive to implement for high-frequency (e.g., 45 GHz or 60 GHz) signal generation. Moreover, harmonic extraction methods may be susceptible to process, voltage and temperature (PVT) variations.

III. SUMMARY

Systems and methods of performing harmonic extraction (e.g., to generate a signal having a particular frequency) and harmonic rejection (e.g., to generate a signal having a particular suppressed frequency component) are disclosed. A hybrid circuit, also referred to herein as a "hybrid," may be used to generate a first output signal that has a particular frequency by extracting a harmonic component of an input signal. A hybrid circuit may also be used to generate a second output signal that has a suppressed frequency component by substantially rejecting a particular harmonic component of an input signal. A hybrid circuit may extract and/or reject a particular harmonic component of an input signal based on phase differences between corresponding harmonic components of signals provided to inputs of the hybrid circuit. For example, the hybrid circuit may receive a first signal at a first input of the hybrid circuit from a first non-linear amplifier and receive a second signal at a second input of the hybrid circuit from a second non-linear amplifier. The first non-linear amplifier may receive an input signal and generate the first signal provided to the first input of the hybrid circuit. The second non-linear amplifier may receive a phase shifted signal from phase shifting circuitry and generate the second signal provided to the second input of the hybrid circuit. The phase shifting circuitry may receive the same input signal that is provided to the first non-linear amplifier and generate the phase shifted signal. Alternatively, the phase shifting circuitry may receive a second input signal related to the input signal provided to the first non-linear amplifier and generate the phase shifted signal. For example, the input signal provided to the first non-linear amplifier and the second input signal provided to the phase shifting circuitry may be first and second signals of a differential input signal.

Because the input signal is provided to the first non-linear amplifier without a phase shift, the harmonic components of the first signal that is generated by the first non-linear amplifier may have substantially the same phase. On the other hand, the harmonic components of the second signal that is generated by the second non-linear amplifier based on the phase shifted signal may have different phases. Accordingly, corresponding harmonic components of the first signal and the second signal may have phase differences. For example, the first harmonic component of the first signal generated by the first non-linear amplifier and the first harmonic component of the second signal generated by the second non-linear amplifier may have a first phase difference. The third harmonic component of the first signal and the third harmonic component of the second signal may have a second phase difference that is different from the first phase difference. Based on the phase differences of corresponding harmonic components of the first signal and the second signal, the hybrid circuit may generate the first output signal having a frequency that corresponds to the third harmonic components of the first signal and the second signal. The hybrid circuit may also generate the second output signal that has a suppressed frequency component corresponding to the third harmonic components of the first signal and the second signal. By using two hybrid circuits, a first differential output signal having a particular frequency and a second differential output signal having a suppressed frequency component may be generated.

In a particular embodiment, a device includes a first hybrid configured to generate a first pair of output signals based on splitting power received via a first pair of input signals. A first input of the first hybrid may be coupled to an output of a first amplifier. The first amplifier may be configured to receive a first input signal. The device may also include a second hybrid configured to generate a second pair of output signals based on splitting power received via a second pair of input signals. A first input of the second hybrid may be coupled to an output of a second amplifier. The second amplifier may be configured to receive a second input signal. The device may further include a first phase shifter that is configured to receive the first input signal and to output a first phase shifted signal that is phase shifted by a first amount from a phase of the first input signal. An output of the first phase shifter may be coupled to an input of a third amplifier, and an output of the third amplifier may be coupled to a second input of the second hybrid. The device may also include a second phase shifter that is configured to receive the second input signal and to output a second phase shifted signal that is phase shifted by a second amount from a phase of the second input signal. An output of the second phase shifter may be coupled to an input of a fourth amplifier, and an output of the fourth amplifier may be coupled to a second input of the first hybrid.

In another particular embodiment, a device includes a first hybrid configured to generate a first pair of output signals based on splitting power received via a first pair of input signals. A first input of the first hybrid may be coupled to an output of a first amplifier. The first amplifier may be configured to receive a first input signal. The device may also include a second hybrid configured to generate a second pair of output signals based on splitting power received via a second pair of input signals. A first input of the second hybrid may be coupled to an output of a second amplifier. The second amplifier may be configured to receive a second input signal. The device may further include a first phase shifter that is configured to receive the first input signal and to output a first phase shifted signal that is phase shifted by a first amount from a phase of the first input signal. An output of the first phase shifter may be coupled to an input of a third amplifier, and an output of the third amplifier is coupled to a second input of the first hybrid. The device may also include a second phase shifter that is configured to receive the second input signal and to output a second phase shifted signal that is phase shifted by a second amount from a phase of the second input signal. An output of the second phase shifter may be coupled to an input of a fourth amplifier, and an output of the fourth amplifier may be coupled to a second input of the second hybrid.

In another particular embodiment, a method includes receiving a first input signal at a first amplifier and amplifying the first input signal to generate a first amplified signal. The first amplified signal is output by the first amplifier and coupled to a first input of a first hybrid. The method may include receiving a second input signal at a second amplifier and amplifying the second input signal to generate a second amplified signal. The second amplified signal is output by the second amplifier and coupled to a first input of a second hybrid. The method may further include receiving the first input signal at a first phase shifter and phase shifting the first input signal to generate a first phase shifted signal. The first phase shifted signal is output by the first phase shifter and coupled to an input of a third amplifier, and an output of the third amplifier may be coupled to a second input of the second hybrid. The method may also include receiving the second input signal at a second phase shifter and phase shifting the second input signal to generate a second phase shifted signal. The second phase shifted signal is output by the second phase shifter and coupled to an input of a fourth amplifier, and an output of the fourth amplifier may be coupled to a second input of the first hybrid.

In another particular embodiment, a method includes receiving a first input signal at a first amplifier and amplifying the first input signal to generate a first amplified signal. The first amplified signal is output by the first amplifier and coupled to a first input of a first hybrid. The method may include receiving a second input signal at a second amplifier and amplifying the second input signal to generate a second amplified signal. The second amplified signal is output by the second amplifier and coupled to a first input of a second hybrid. The method may further include receiving the first input signal at a first phase shifter and phase shifting the first input signal to generate a first phase shifted signal. The first phase shifted signal is output by the first phase shifter and coupled to an input of a third amplifier, and an output of the third amplifier may be coupled to a second input of the first hybrid. The method may also include receiving the second input signal at a second phase shifter and phase shifting the second input signal to generate a second phase shifted signal. The second phase shifted signal is output by the second phase shifter and coupled to an input of a fourth amplifier, and an output of the fourth amplifier may be coupled to a second input of the second hybrid.

In another particular embodiment, an apparatus includes first means for generating a first output signal and a second output signal. The first output signal may be phase shifted from the second output signal. A first input of the first means for generating may be coupled to an output of first means for amplifying. The first means for amplifying may be configured to receive a first input signal. The apparatus may also include second means for generating a third output signal and a fourth output signal. The third output signal may be phase shifted from the fourth output signal. A first input of the second means for generating may be coupled to an output of second means for amplifying. The second means for amplifying may be configured to receive a second input signal. The apparatus may further include first means for phase shifting that is configured to receive the first input signal. An output of the first means for phase shifting may be coupled to an input of third means for amplifying, and an output of the third means for amplifying may be coupled to a second input of the second means for generating. The apparatus may also include second means for phase shifting that is configured to receive the second input signal. An output of the second means for phase shifting may be coupled to an input of fourth means for amplifying, and an output of the fourth means for amplifying may be coupled to a second input of the first means for generating.

In another particular embodiment, an apparatus includes first means for generating a first output signal and a second output signal. A first output signal may be phase shifted from the second output signal. A first input of the first means for generating may be coupled to an output of first means for amplifying. The first means for amplifying may be configured to receive a first input signal. The apparatus may also include second means for generating a third output signal and a fourth output signal. The third output signal may be phase shifted from the fourth output signal. A first input of the second means for generating may be coupled to an output of second means for amplifying, and the second means for amplifying may be configured to receive a second input signal. The apparatus may further include first means for phase shifting that is configured to receive the first input signal. An output of the first means for phase shifting may be coupled to an input of third means for amplifying, and an output of the third means for amplifying may be coupled to a second input of the first means for generating. The apparatus may also include second means for phase shifting that is configured to receive the second input signal. An output of the second means for phase shifting may be coupled to an input of fourth means for amplifying, and an output of the fourth means for amplifying may be coupled to a second input of the second means for generating.

One particular advantage provided by at least one of the disclosed embodiments is separation of harmonic components of an input signal. By separating the harmonic components of an input signal, a desired harmonic component of the input signal may be extracted, and a particular harmonic component of the input signal may be rejected.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
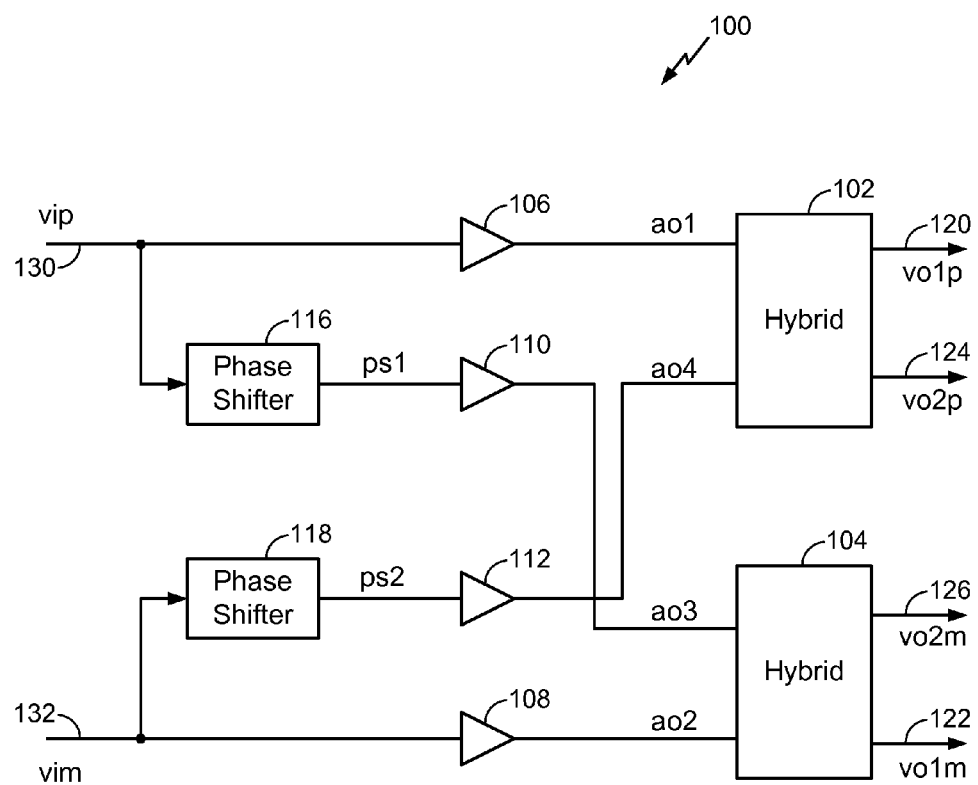
FIG. 1 is a block diagram of a particular embodiment of a device operable to perform harmonic extraction and rejection.

Referring to FIG. 1, particular embodiment of a device operable to perform harmonic extraction and rejection is depicted and generally designated 100. The device 100 includes a first hybrid 102 and a second hybrid 104. The first hybrid 102 and the second hybrid 104, also referred to herein as "hybrid circuits," may each be operable to perform harmonic extraction and harmonic rejection based on phase differences of corresponding harmonic components of a pair of inputs, as further described herein.

Typically, a hybrid is used as a power coupling device in certain radiofrequency (RF) (e.g., microwave) applications. For example, the hybrid may have a first input port, a first output port, and a second output port. The hybrid may split power applied at the first input port between the first output port and the second output port. The hybrid may also have a fourth port (e.g., a second input port) that is referred to as an isolated port and that is used for reverse power coupling. In some implementations, transmission line(s) within the hybrid may have lengths that differ by one-quarter wavelength ($\lambda/4$), resulting in a 90-degree phase difference between the signals at the output ports. Such a hybrid may be referred to as a 90-degree hybrid. However, higher order harmonics of the output signals may have a larger phase difference than 90 degrees. For example, second order harmonics may have a phase difference of 180 degrees and third order harmonics may have a phase difference of 270 degrees (i.e., −90 degrees). The phase differences between harmonics may be used to cancel certain harmonics while extracting other harmonics. For example, instead of applying in-phase signals to the two input ports of the 90-degree hybrid, a phase difference of 90 degrees may be introduced between the input signals. Introducing a phase difference of 90 degrees may result in cancellation of a second order harmonic and selective extraction or suppression of a first order harmonic and/or a third order harmonic, as further described herein. In a particular embodiment, the first hybrid 102 and the second hybrid 104 are 90-degree hybrids having two inputs and two outputs, as further described herein.

The device 100 also includes a first amplifier 106, a second amplifier 108, a third amplifier 110, and a fourth amplifier 112. The first amplifier 106 and the fourth amplifier 112 may be coupled to the first hybrid 102. The second amplifier 108 and the third amplifier 110 may be coupled to the second hybrid 104. The device 100 further includes a first phase shifter 116 and a second phase shifter 118. An output of the first phase shifter 116 may be coupled to an input of the third amplifier 110, and an output of the second phase shifter 118 may be coupled to an input of the fourth amplifier 112.

In a particular embodiment, a first input line 130 is coupled to an input of the first amplifier 106 and to an input of the first phase shifter 116. A second input line 132 is coupled to an input of the second amplifier 108 and to an input of the second phase shifter 118. To illustrate, the first amplifier 106 and the first phase shifter 116 may receive a first input signal (vip) via the first input line 130, and the second amplifier 108 and the second phase shifter 118 may receive a second input signal (vim) via the second input line 132.

In a particular embodiment, the first input signal (vip) may be a first signal of a differential input signal (vip, vim), and the second input signal (vim) may be a second signal of the differential input signal (vip, vim). For example, the first input signal (vip) and the second input signal (vim) may be complementary to each other. To illustrate, the second input signal (vim) may be phase shifted 180 degrees from the first input signal (vip).

In a particular embodiment, the first phase shifter 116 may be configured to generate a first phase shifted signal (ps1) and to provide the first phase shifted signal (ps1) to the third amplifier 110. To illustrate, the first phase shifter 116 may generate the first phase shifted signal (ps1) by phase shifting the first input signal (vip). For example, the first phase shifter 116 may be a 90-degree phase shifter, and the first input signal (vip) may have approximately a 0-degree phase. The first phase shifter 116 may generate, at an output of the first phase shifter 116, the first phase shifted signal (ps1) that is phase shifted by approximately 90 degrees from a phase of the first input signal (vip).

In a particular embodiment, the second phase shifter 118 may be configured to generate a second phase shifted signal (ps2) and to provide the second phase shifted signal (ps2) to the fourth amplifier 112. To illustrate, the second phase shifter 118 may generate the second phase shifted signal (ps2) by phase shifting the second input signal (vim). For example, the second phase shifter 118 may be a 90-degree phase shifter, and the second input signal (vim) may have approximately a 0-degree phase. The second phase shifter 118 may generate, at an output of the second phase shifter 118, the second phase shifted signal (ps2) that is phase shifted by approximately 90 degrees from the phase of the second input signal (vim). As another non-limiting example, if the second input signal (vim) has approximately a 180-degree phase, the second phase shifter 118 may shift the phase of the second input signal (vim) by approximately 90 degrees to generate the second phase shifted signal (ps2) that has approximately a 270-degree (i.e., −90-degree) phase.

In a particular embodiment, the first amplifier 106 may be configured to generate a first signal (ao1) (e.g., a first amplified signal) by amplifying the first input signal (vip), and the second amplifier 108 may be configured to generate a second signal (ao2) (e.g., a second amplified signal) by amplifying the second input signal (vim). The third amplifier 110 may be configured to generate a third signal (ao3) (e.g., a third amplified signal) by amplifying the first phase shifted signal (ps1) generated by the first phase shifter 116 by phase shifting the first input signal (vip). The fourth amplifier 112 may be configured to generate a fourth signal (ao4) (e.g., a fourth amplified signal) by amplifying the second phase shifted signal (ps2) generated by the second phase shifter 118 by phase shifting the second input signal (vim). In a particular embodiment, each of the first amplifier 106, the second amplifier 108, the third amplifier 110, and the fourth amplifier 112 may be a single n-channel metal-oxide-semiconductor (NMOS) transistor or a single p-channel metal-oxide-semiconductor (PMOS) transistor.

In a particular embodiment, the first amplifier 106 may have non-linear characteristics. For example, Equation (1) may represent a relationship between the first input signal (vip) provided to the first amplifier 106 and the first signal (ao1) generated by the first amplifier 106. To illustrate, in Equation (1), x represents an input signal and y represents an output signal.

$$y = a_1 x + a_2 x^2 + a_3 x^3 + \quad \text{Equation (1)}$$

The first term, $a_1 x$, may represent the first harmonic component of the output y, the second term, $a_2 x^2$, may represent the second harmonic component of the output y, and the third term, $a_3 x^3$, may represent the third harmonic component of the output y.

For example, if $x = \cos(wt+\theta)$, $$y = a_1 \cos(wt+\theta) + a_2 \cos(2wt+2\theta) + a_3 \cos(3wt+3\theta) + \quad \text{Equation (2)}$$

For example, with respect to the first amplifier 106, if the first input signal (vip) provided to the first amplifier 106 has a 0-degree phase, the first signal (ao1) generated by the first amplifier 106 may have a first harmonic component and a third harmonic component that each have a 0-degree phase. If the first input signal (vip) provided to the first amplifier 106 has approximately a 180-degree phase, the first signal (ao1) may have a first harmonic component and a third harmonic component that each have approximately a 180-degree phase. If the first input signal (vip) has a phase other than both approximately 0-degree and approximately 180-degree, the phase of the first harmonic component of the first signal (ao1) may be different from the phase of the third harmonic component of the first signal (ao1) because of the non-linear characteristics of the first amplifier 106.

In a particular embodiment, the second amplifier 108 may have non-linear characteristics. To illustrate, Equation (1) and Equation (2) may represent a relationship between the second input signal (vim) provided to the second amplifier 108 and the second signal (ao2) generated by the second amplifier 108. For example, if the second input signal (vim) has a 0-degree phase, the second signal (ao2) may have a first harmonic component and a third harmonic component that each have a 0-degree phase. As another non-limiting example, if the second input signal (vim) has approximately a 180-degree phase, the second signal (ao2) may have a first harmonic component and a third harmonic component that each have approximately a 180-degree phase. If the second input signal (vim) has a phase other than both approximately 0 degree and approximately 180 degrees, the phase of the first harmonic component of the second signal (ao2) may be different from the phase of the third harmonic component of the second signal (ao2) because of the non-linear characteristics of the second amplifier 108.

In a particular embodiment, the third amplifier 110 may have non-linear characteristics. To illustrate, Equation (1) and Equation (2) may represent a relationship between the first phase shifted signal (ps1) provided to the third amplifier 110 and the third signal (ao3) generated by the third amplifier 110. For example, if the first phase shifted signal (ps1) has a 0-degree phase, the third signal (ao3) may have a first harmonic component and a third harmonic component that each have a 0-degree phase. As another non-limiting example, if the first phase shifted signal (ps1) has approximately a 180-degree phase, the third signal (ao3) may have a first harmonic component and a third harmonic component that each have approximately a 180-degree phase. If the first phase shifted signal (ps1) has a phase that is different from both approximately 0 degree and approximately 180 degrees, the phase of the first harmonic component of the third signal (ao3) may be different from the phase of the third harmonic component of the third signal (ao3) because of the non-linear characteristics of the third amplifier 110. For example, if first phase shifted signal (ps1) has approximately a 90-degree phase, the first harmonic component of the third signal (ao3) may have approximately a 90-degree phase, and the third harmonic component of the third signal (ao3) may have approximately a 270-degree (i.e. −90-degree) phase.

In a particular embodiment, the fourth amplifier 112 may have non-linear characteristics. To illustrate, Equation (1) and Equation (2) may represent a relationship between the second phase shifted signal (ps2) provided to the fourth amplifier 112 and the fourth signal (ao4) generated by the fourth amplifier 112. For example, if the second phase shifted signal (ps2) provided to the fourth amplifier 112 has a 0-degree phase, the fourth signal (ao4) generated by the fourth amplifier 112 may have a first harmonic component and a third harmonic component that each have a 0-degree phase. As another non-limiting example, if the second phase shifted signal (ps2) provided to the fourth amplifier 112 has approximately a 180-degree phase, the fourth signal (ao4) generated by the fourth amplifier 112 may have a first harmonic component and a third harmonic component that each have approximately a 180-degree phase. If the second phase shifted signal (ps2) has a phase that is different from both approximately 0 degree and approximately 180 degrees, the phase of the first harmonic component of the fourth signal (ao4) may be different from the phase of the third harmonic component of the fourth signal (ao4) because of the non-linear characteristics of the fourth amplifier 112. For example, if second phase shifted signal (ps2) has approximately a 90-degree phase, the first harmonic component of the fourth signal (ao4) may have approximately a 90-degree phase, and the third harmonic component of the fourth signal (ao4) may have approximately a 270-degree (i.e. −90-degree) phase. As another non-limiting example, if the second phase shifted signal (ps2) has approximately a 270-degree (i.e., −90-degree) phase, the first harmonic component of the fourth signal (ao4) may have approximately a 270-degree (i.e., −90-degree) phase, and the third harmonic component of the fourth signal (ao4) may have approximately a −270-degree (i.e. 90-degree) phase.

In a particular embodiment, the first hybrid has two inputs and two outputs and may generate a first pair of output signals based on splitting power received via a first pair of input signals. The second hybrid may have two inputs and two outputs and may generate a second pair of output signals based on splitting power received via a second pair of input signals. For example, a first input of the first hybrid 102 may be coupled to an output of the first amplifier 106, and a second input of the first hybrid 102 may be coupled to an output of the fourth amplifier 112. Similarly, a first input of the second hybrid 104 may be coupled to an output of the second amplifier 108, and a second input of the second hybrid 104 may be coupled to an output of the third amplifier 110. To illustrate, the first amplifier 106 may provide a first signal (ao1) to the first input of the first hybrid 102, and the second amplifier 108 may provide a second signal (ao2) to the first input of the second hybrid 104. Similarly, the third amplifier 110 may provide a third signal (ao3) to the second input of the second hybrid 104, and the fourth amplifier 112 may provide a fourth signal (ao4) to the second input of the first hybrid 102.

In a particular embodiment, the first hybrid 102 may be a 90-degree hybrid. The first hybrid 102 may be configured to output a first pair of output signals. For example, the first hybrid 102 may be configured to output a first output signal (vo1p) at a first output 120 of the first hybrid 102. The first hybrid 102 may also be configured to output a second output signal (vo2p) at a second output 124 of the first hybrid 102. For example, the first hybrid 102 may generate the first output signal (vo1p) and the second output signal (vo2p) based on phase differences between corresponding harmonic components of the first signal (ao1) and harmonic components of the fourth signal (ao4).

To illustrate, a phase difference between the first harmonic component of the fourth signal (ao4) and the first harmonic component of the first signal (ao1) may be different from a phase difference between the third harmonic component of the fourth signal (ao4) and the third harmonic of the first signal (ao1). For example, the first harmonic component of the first signal (ao1) and the third harmonic component of the first signal (ao1) may each have approximately a 0-degree phase. If the second input signal (vim) has a 180-degree phase, the first harmonic component of the fourth signal (ao4) may have approximately a 270-degree (i.e., −90-degree) phase, and the third harmonic component of the fourth signal (ao4) may have approximately a 90-degree phase. Accordingly, the phase difference between the first harmonic component of the fourth signal (ao4) and the first harmonic component of the first signal (ao1) may be approximately 270-degree (i.e., −90-degree), and the phase difference between the third harmonic component of the fourth signal (ao4) and the third harmonic component of the first signal (ao1) may be approximately 90 degrees.

For example, the first hybrid 102 may generate the first output signal (vo1p) based on the approximately 90-degree phase difference between the third harmonic component of the fourth signal (ao4) and the third harmonic component of the first signal (ao1). For example, the first output signal (vo1p) may have a frequency corresponding to the third harmonic component of the first signal (ao1) and to the third harmonic component of the fourth signal (ao4). To illustrate, if the first input signal (vip) has a 15 GHz frequency, the third harmonic component of the first signal (ao1) may have a 45 GHz frequency. Similarly, if the second input signal (vim) has a 15 GHz frequency, the third harmonic component of the fourth signal (ao4) may have a 45 GHz frequency. Accordingly, the first hybrid 102 may generate the first output signal (vo1p) such that the first output signal (vo1p) has a 45 GHz frequency. The first hybrid 102 may also generate the second output signal (vo2p) based on the approximately −90-degree phase difference between the first harmonic component of the fourth signal (ao4) and the first harmonic component of the first signal (ao1). For example, the second output signal (vo2p) may have a frequency corresponding to the first harmonic component of the first signal (ao1) and to the first harmonic component of the fourth signal (ao4). To illustrate, if the first input signal (vip) has a 15 GHz frequency, the first harmonic component of the first signal (ao1) may have a 15 GHz frequency. Similarly, if the second input signal (vim) has a 15 GHz frequency, the first harmonic component of the fourth signal (ao4) may have a 15 GHz frequency. Accordingly, the first hybrid 102 may generate the second output signal (vo2p) such that the second output signal (vo2p) has a 5 GHz frequency. The first hybrid 102 may also substantially reject the third harmonic component of the first signal (ao1) and the third harmonic component of the fourth signal (ao4) in generating the second output signal (vo2p). Accordingly, the second output signal (vo2p) may have a substantially suppressed third harmonic component (i.e., substantially suppressed spectral energy at the third harmonic frequency of the second output signal (vo2p)).

Because the first signal (ao1) and the fourth signal (ao4) are derived respectively from the first input signal (vip) and the second input signal (vim), the frequency of the first output signal (vo1p) may correspond to the third harmonic component of the first input signal (vip) and to the third harmonic component of the second input signal (vim). Similarly, the frequency of the second output signal (vo2p) may correspond to the first harmonic component of the first input signal (vip) and to the first harmonic component of the second input signal (vim).

In a particular embodiment, the second hybrid 104 may be a 90-degree hybrid. The second hybrid 104 may be configured to output a second pair of output signals. For example, the second hybrid 104 may be configured to output a first output signal (vo1m) at a first output 122 of the second hybrid 104. The second hybrid 104 may also be configured to output a second output signal (vo2m) at a second output 126 of the second hybrid 104. For example, the second hybrid 104 may generate the first output signal (vo1m) and the second output signal (vo2m) based on phase differences between corresponding harmonic components of the second signal (ao2) and harmonic components of the third signal (ao3).

To illustrate, a phase difference between the first harmonic component of the third signal (ao3) and the first harmonic component of the second signal (ao2) may be different from a phase difference between the third harmonic component of the third signal (ao3) and the third harmonic of the second signal (ao2). For example, if the second input signal (vim) has a 180-degree phase, the first harmonic component of the second signal (ao2) and the third harmonic component of the second signal (ao2) may each have approximately a 180-degree phase. The first harmonic component of the third signal (ao3) may have approximately a 90-degree phase, and the third harmonic component of the third signal (ao3) may have approximately a 270-degree (i.e., −90-degree) phase. Accordingly, the phase difference between the first harmonic component of the third signal (ao3) and the first harmonic component of the second signal (ao2) may be approximately −90 degrees, and the phase difference between the third harmonic component of the third signal (ao3) and the third harmonic component of the second signal (ao2) may be approximately 90 degrees.

The second hybrid 104 may generate the first output signal (vo1m) based on the approximately 90-degree phase difference between the third harmonic component of the third signal (ao3) and the third harmonic component of the second signal (ao2). For example, the first output signal (vo1m) may have a frequency corresponding to the third harmonic component of the second signal (ao2) and to the third harmonic component of the third signal (ao3). To illustrate, if the first input signal (vim) has a 15 GHz frequency, the third harmonic component of the second signal (ao2) may have a 45 GHz frequency. Similarly, if the first input signal (vip) has a 15 GHz frequency, the third harmonic component of the third signal (ao3) may have a 45 GHz frequency. Accordingly, the second hybrid 104 may generate the first output signal (vo1m) such that the first output signal (vo1m) has a 45 GHz frequency. The second hybrid 104 may also generate the second output signal (vo2m) based on the approximately −90-degree phase difference between the first harmonic component of the third signal (ao3) and the first harmonic component of the second signal (ao2). For example, the second output signal (vo2m) may have a frequency corresponding to the first harmonic component of the second signal (ao2) and to the first harmonic component of the third signal (ao3). To illustrate, if the first input signal (vim) has a 15 GHz frequency, the first harmonic component of the second signal (ao2) may have a 15 GHz frequency. Similarly, if the first input signal (vip) has a 15 GHz frequency, the first harmonic component of the third signal (ao3) may have a 15 GHz frequency. Accordingly, the second hybrid 104 may generate the second output signal (vo2m) such that the second output signal (vo2m) has a 15 GHz frequency. The second hybrid 104 may also substantially reject the third harmonic component of the second signal (ao2) and the third harmonic component of the third signal (ao3) in generating the second output signal (vo2m). Accordingly, the second output signal (vo2m) may have a substantially suppressed third harmonic component (i.e., substantially suppressed spectral energy at the third harmonic frequency of the second output signal (vo2m)).

Because the second signal (ao2) and the third signal (ao3) are derived respectively from the first input signal (vim) and the first input signal (vip), the frequency of the first output signal (vo1m) may correspond to the third harmonic component of the first input signal (vip) and to the third harmonic component of the second input signal (vim). Similarly, the frequency of the second output signal (vo2m) may correspond to the first harmonic component of the first input signal (vip) and to the first harmonic component of the second input signal (vim).

In a particular embodiment, the first output signal (vo1p) and the first output signal (vo1m) may form a first signal and a second signal of a first differential output signal (vo1p, vo1m). Similarly, the second output signal (vo2p) and the second output signal (vo2m) may form a first signal and a second signal of a second differential output signal (vo2p, vo2m).

During operation, the first amplifier 106 and the first phase shifter 116 may receive the first input signal (vip), and the second amplifier 108 and the second phase shifter 118 may receive the second input signal (vim). For example, the first input signal (vip) may have approximately a 0-degree phase, and the second input signal (vim) may have approximately a 180-degree phase. The first phase shifter 116 may shift the first input signal (vip), for example, by approximately 90 degrees to generate the first phase shifted signal (ps1) that has approximately a 90-degree phase. Similarly, the second phase shifter 118 may shift the second input signal (vim), for example, by approximately 90 degrees to generate the second phase shifted signal (ps2) that has approximately a 270-degree (i.e., −90-degree) phase.

The first amplifier 106 may generate the first signal (ao1) based on the first input signal (vip). Because the first input signal (vip) has approximately a 0-degree phase, the first harmonic component of the first signal (ao1) and the third first harmonic component of the first signal (ao1) may each have approximately a 0-degree phase. The second amplifier 108 may generate the second signal (ao2) based on the second input signal (vim). Because the second input signal (vim) has approximately a 180-degree phase, the first harmonic component of the second signal (ao2) and the third first harmonic component of the second signal (ao2) may each have approximately a 180-degree phase.

The third amplifier 110 may generate the third signal (ao3) based on the first phase shifted signal (ps1) that is generated based on the first input signal (vip). Because the first phase shifted signal (ps1) has approximately a 90-degree phase, the first harmonic component of the third signal (ao3) may have a 90-degree phase, and the third first harmonic component of the third signal (ao3) may have approximately a 270-degree (i.e., −90-degree) phase. The fourth amplifier 112 may generate the fourth signal (ao4) based on the second phase shifted signal (ps2) that is generated based on the second input signal (vim). Because the second phase shifted signal (ps2) has approximately a −90-degree phase, the first harmonic component of the fourth signal (ao4) may have approximately a −90-degree phase, and the third harmonic component of the fourth signal (ao4) may have approximately a −270-degree (i.e., 90-degree) phase.

The first hybrid 102 may generate the first output signal (vo1p) that has a frequency corresponding to the third harmonic component of the first signal (ao1) and to the third harmonic component of the fourth signal (ao4). The first hybrid 102 may also generate the second output signal (vo2p) that has a frequency corresponding to the first harmonic component of the first signal (ao1) and to the first harmonic component of the fourth signal (ao4). For example, if a frequency of the differential input signal (vip, vim) is approximately 15 GHz, the first harmonic component of the first signal (ao1) and the first harmonic component of the fourth signal (ao4) may also have approximately a 15 GHz frequency, and the third harmonic component of the first signal (ao1) and the third harmonic component of the fourth signal (ao4) may have approximately a 45 GHz frequency. Accordingly, the frequency of the first output signal (vo1p) may be approximately 45 GHz, and the frequency of the second output signal (vo2p) may be approximately 15 GHz. In addition, the second output signal (vo2p) may have a substantially suppressed frequency component at 45 GHz (i.e., corresponding to the third harmonic component of the differential input signal (vip, vim)).

The second hybrid 104 may generate the first output signal (vo1m) that has a frequency corresponding to the third harmonic component of the second signal (ao2) and to the third harmonic component of the third signal (ao3). The second hybrid 104 may also generate the second output signal (vo2m) that has a frequency corresponding to the first harmonic component of the second signal (ao2) and to the first harmonic component of the third signal (ao3). For example, if a frequency of the differential input signal (vip, vim) is approximately 15 GHz, the first harmonic component of the second signal (ao2) and the first harmonic component of the third signal (ao3) may also be approximately 15 GHz frequency, and the third harmonic component of the second signal (ao2) and the third harmonic component of the third signal (ao3) may be approximately 45 GHz frequency. Accordingly, a frequency of the first output signal (vo1m) may also be approximately 45 GHz, and a frequency of the second output signal (vo2m) may be approximately 15 GHz. In addition, the second output signal (vo2m) may have a substantially suppressed frequency component at 45 GHz (i.e., corresponding to the third harmonic component of the differential input signal (vip, vim)).

By separating the harmonic components of the differential input signal (vip, vim), the first differential output signal (vo1p, vo1m) with a desired frequency may be generated by extracting a particular harmonic component of the differential input signal (vip, vim). By extracting the particular harmonic component, the first differential output signal (vo1p, vo1m) may have a desired frequency that is higher than the frequency of the differential input signal (vip, vim). For example, by having a higher frequency, the differential output signal (vo1p, vo1m) may be used to transmit and/or to receive a signal at a higher rate. In addition, by separating the harmonic components of the differential input signal (vip, vim), the second differential output signal (vo2p, vo2m) that has a suppressed harmonic component may be generated by rejecting a particular harmonic component of the differential input signal (vip, vim). Using the second differential output signal (vo2p, vo2m) that has the suppressed harmonic component may substantially eliminate a need to use a filter (e.g., an LC tank circuit) to filter out the suppressed harmonic component from the differential input signal (vip, vim).

Although the operation of the device 100 is described above based on the first input signal (vip) having a 0-degree phase and the second input signal (vim) having approximately a 180-degree phase, in other embodiments, the first input signal (vip) and the second input signal (vim) may have other phase values. In addition, although the operation of the device 100 is described above based on each of the first phase shifter 116 and the second phase shifter 118 shifting a corresponding input signal by approximately 90 degrees, in other embodiments, each of the first phase shifter 116 and the second phase shifter 118 may shift the corresponding input signal by a different amount. For example, each of the first phase shifter 116 and the second phase shifter 118 may shift a corresponding input signal by approximately 270 degrees.

Figure 2:
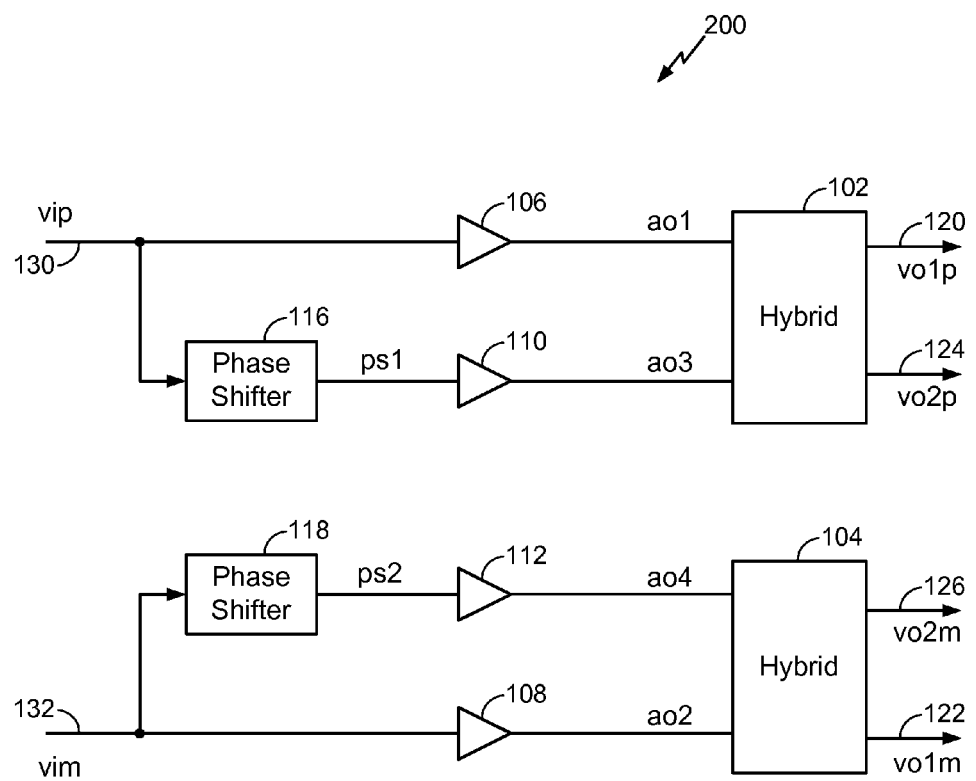
FIG. 2 is a block diagram of another particular embodiment of a device operable to perform harmonic extraction and rejection.

Referring to FIG. 2, another particular embodiment of a device operable to perform harmonic extraction and rejection is depicted and generally designated 200. The device 200 includes the first hybrid 102 and the second hybrid 104. The device 200 also includes the first amplifier 106, the second amplifier 108, the third amplifier 110, and the fourth amplifier 112. The first amplifier 106 and the third amplifier 110 may be coupled to the first hybrid 102. The second amplifier 108 and the fourth amplifier 112 may be coupled to the second hybrid 104. The device 200 further includes the first phase shifter 116 and the second phase shifter 118.

In a particular embodiment, the first input line 130 is coupled to the input of the first amplifier 106 and to the input of the first phase shifter 116. The second input line 132 is coupled to the input of the second amplifier 108 and to the input of the second phase shifter 118. The output of the first phase shifter 116 may be coupled to the input of the third amplifier 110, and the output of the second phase shifter 118 may be coupled to an input of the fourth amplifier 112. In a particular embodiment, the first phase shifter 116 and the second phase shifter 118 may respectively correspond to the first phase shifter 116 and the second phase shifter 118 of FIG. 1 and may operate in the manner described with respect to FIG. 1.

In a particular embodiment, the output of the first amplifier 106 is coupled to the first input of the first hybrid 102, and the output of the third amplifier 110 is coupled to the second input of the first hybrid 102. Similarly, the output of the second amplifier 108 may be coupled to the first input of the second hybrid 104, and the output of the fourth amplifier 112 may be coupled to the second input of the second hybrid 104. To illustrate, the first amplifier 106 may provide a first signal (ao1) to the first input of the first hybrid 102, and the second amplifier 108 may provide a second signal (ao2) to the first input of the second hybrid 104. Similarly, the third amplifier 110 may provide a third signal (ao3) to the second input of the first hybrid 102, and the fourth amplifier 112 may provide a fourth signal (ao4) to the second input of the second hybrid 104. In a particular embodiment, the first amplifier 106, the second amplifier 108, the third amplifier 110, and the fourth amplifier 112 may respectively correspond to the first amplifier 106, the second amplifier 108, the third amplifier 110, and the fourth amplifier 112 of FIG. 1 and may operate in the manner described with respect to FIG. 1.

In a particular embodiment, the first hybrid 102 may generate the first output signal (vo1p) based on a phase difference between the first harmonic component of the third signal (ao3) and the first harmonic component of the first signal (ao1). For example, the first output signal (vo1p) may have a frequency corresponding to the first harmonic component of the first signal (ao1) and to the first harmonic component of the third signal (ao3). Because the first signal (ao1) and the third signal (ao3) are derived from the first input signal (vip), the frequency of the first output signal (vo1p) may correspond to the first harmonic component of the first input signal (vip). In a particular embodiment, the first hybrid 102 may substantially reject the third harmonic component of the first signal (ao1) and the third harmonic component of the third signal (ao3) in generating the first output signal (vo1p). Accordingly, the first hybrid 102 may generate the first output signal (vo1p) such that the first output signal (vo1p) has a substantially suppressed third harmonic component.

In a particular embodiment, the first hybrid 102 may generate the second output signal (vo2p) based on a phase difference between the third harmonic component of the third signal (ao3) and the third harmonic component of the first signal (ao1). For example, the second output signal (vo2p) may have a frequency corresponding to the third harmonic component of the first signal (ao1) and to the third harmonic component of the third signal (ao3). Because the first signal (ao1) and the third signal (ao3) are derived from the first input signal (vip), the frequency of the second output signal (vo2p) may also correspond to the third harmonic component of the first input signal (vip).

In a particular embodiment, the second hybrid 104 may generate the first output signal (vo1m) based on a phase difference between the first harmonic component of the fourth signal (ao4) and the first harmonic component of the second signal (ao2). For example, the first output signal (vo1m) may have a frequency corresponding to the first harmonic component of the second signal (ao2) and to the first harmonic component of the fourth signal (ao4). Because the second signal (ao2) and the fourth signal (ao4) are derived from the second input signal (vim), the frequency of the first output signal (vo1m) may correspond to the first harmonic component of the second input signal (vim). In a particular embodiment, the second hybrid 104 may substantially reject the third harmonic component of the second signal (ao2) and the third harmonic component of the fourth signal (ao4) in generating the first output signal (vo1m). Accordingly, the second hybrid 104 may generate the first output signal (vo1m) such that the first output signal (vo1m) has a substantially suppressed third harmonic component.

In a particular embodiment, the second hybrid 104 may generate the second output signal (vo2m) based on a phase difference between the third harmonic component of the fourth signal (ao4) and the third harmonic component of the second signal (ao2). For example, the second output signal (vo2m) may have a frequency corresponding to the third harmonic component of the second signal (ao2) and to the third harmonic component of the fourth signal (ao4). Because the second signal (ao2) and the fourth signal (ao4) are derived from the second input signal (vim), the frequency of the second output signal (vo2p) may also correspond to the third harmonic component of the second input signal (vim).

In a particular embodiment, the first output signal (vo1p) and the first output signal (vo1m) may form a first signal and a second signal of the first differential output signal (vo1p, vo1m). Similarly, the second output signal (vo2p) and the second output signal (vo2m) may form the first signal and a second signal of a second differential output signal (vo2p, vo2m).

During operation, the first amplifier 106 and the first phase shifter 116 may receive the first input signal (vip), and the second amplifier 108 and the second phase shifter 118 may receive the second input signal (vim). For example, the first input signal (vip) may have approximately a 0-degree phase, and the second input signal (vim) may have approximately a 180-degree phase. The first phase shifter 116 may shift the first input signal (vip), for example, by approximately 90 degrees to generate the first phase shifted signal (ps1) that has approximately a 90-degree phase. Similarly, the second phase shifter 118 may shift the second input signal (vim), for example, by approximately 90 degrees to generate the second phase shifted signal (ps2) that has approximately a 270-degree (i.e., −90-degree) phase.

The first amplifier 106 may generate the first signal (ao1) based on the first input signal (vip). Because the first input signal (vip) has approximately a 0-degree phase, the first harmonic component of the first signal (ao1) and the third first harmonic component of the first signal (ao1) may each have approximately a 0-degree phase. The second amplifier 108 may generate the second signal (ao2) based on the second input signal (vim). Because the second input signal (vim) has approximately a 180-degree phase, the first harmonic component of the second signal (ao2) and the third first harmonic component of the second signal (ao2) may each have approximately a 180-degree phase.

The third amplifier 110 may generate the third signal (ao3) based on the first phase shifted signal (ps1) that is generated based on the first input signal (vip). Because the first phase shifted signal (ps1) has approximately a 90-degree phase, the first harmonic component of the third signal (ao3) may have approximately a 90-degree phase, and the third first harmonic component of the third signal (ao3) may have approximately a 270-degree (i.e., −90-degree) phase. The fourth amplifier 112 may generate the fourth signal (ao4) based on the second phase shifted signal (ps2) that is generated based on the second input signal (vim). Because the second phase shifted signal (ps2) has approximately a −90-degree phase, the first harmonic component of the fourth signal (ao4) may have approximately a −90-degree phase, and the third first harmonic component of the fourth signal (ao4) may have approximately a −270-degree (i.e., 90-degree) phase.

The first hybrid 102 may generate the first output signal (vo1$p$) that has a frequency corresponding to the first harmonic component of the first signal (ao1) and to the third harmonic component of the third signal (ao3). The first hybrid 102 may also generate the second output signal (vo2$p$) that has a frequency corresponding to the third harmonic component of the first signal (ao1) and to the third harmonic component of the third signal (ao3). For example, if a frequency of the differential input signal (vip, vim) is approximately 15 GHz, the first harmonic component of the first signal (ao1) and the first harmonic component of the third signal (ao3) may also have approximately a 15 GHz frequency, and the third harmonic component of the first signal (ao1) and the third harmonic component of the third signal (ao3) may have approximately a 45 GHz frequency. Accordingly, the frequency of the first output signal (vo1$p$) may be approximately 15 GHz, and the frequency of the second output signal (vo2$p$) may be approximately 45 GHz. In addition, the first output signal (vo1$p$) may have a substantially suppressed frequency component at 45 GHz (i.e., corresponding to the third harmonic component of the differential input signal (vip, vim)).

The second hybrid 104 may generate the first output signal (vo1$m$) that has a frequency corresponding to the first harmonic component of the second signal (ao2) and to the first harmonic component of the fourth signal (ao4). The second hybrid 104 may also generate the second output signal (vo2$m$) that has a frequency corresponding to the third harmonic component of the second signal (ao2) and to the third harmonic component of the fourth signal (ao4). For example, if a frequency of the differential input signal (vip, vim) is approximately 15 GHz, the first harmonic component of the second signal (ao2) and the first harmonic component of the fourth signal (ao4) may have approximately a 15 GHz frequency, and the third harmonic component of the second signal (ao2) and the third harmonic component of the fourth signal (ao4) may have approximately a 45 GHz frequency. Accordingly, the frequency of the first output signal (vo1$m$) may also be approximately 15 GHz, and the frequency of the second output signal (vo2$m$) may be approximately 45 GHz. In addition, the first output signal (vo1$m$) may have a substantially suppressed frequency component at 45 GHz (i.e., corresponding to the third harmonic component of the differential input signal (vip, vim)).

By separating the harmonic components of the differential input signal (vip, vim), the first differential output signal (vo1$p$, vo1$m$) that has a suppressed harmonic component may be generated by rejecting a particular harmonic component of the differential input signal (vip, vim). In addition, by separating the harmonic components of the differential input signal (vip, vim), the first differential output signal (vo2$p$, vo2$m$) that has a desired frequency may be generated by extracting a particular harmonic component of the differential input signal (vip, vim). By extracting the particular harmonic component, the first differential output signal (vo1$p$, vo1$m$) may have a desired frequency that is higher than the frequency of the differential input signal (vip, vim). For example, by having a higher frequency, the differential output signal (vo2$p$, vo2$m$) may be used to transmit and/or to receive a signal at a higher rate.

Although the operation of the device 200 is described above based on the first input signal (vip) having a 0-degree phase and the second input signal (vim) having approximately a 180-degree phase, in other embodiments, the first input signal (vip) and the second input signal (vim) may have other phase values. In addition, although the operation of the device 200 is described above based on each of the first phase shifter 116 and the second phase shifter 118 shifting a corresponding input signal by approximately 90 degrees, in other embodiments, each of the first phase shifter 116 and the second phase shifter 118 may shift the corresponding input signal by a different amount. For example, each of the first phase shifter 116 and the second phase shifter 118 may shift a corresponding input signal by approximately 270 degrees.

Figure 3:
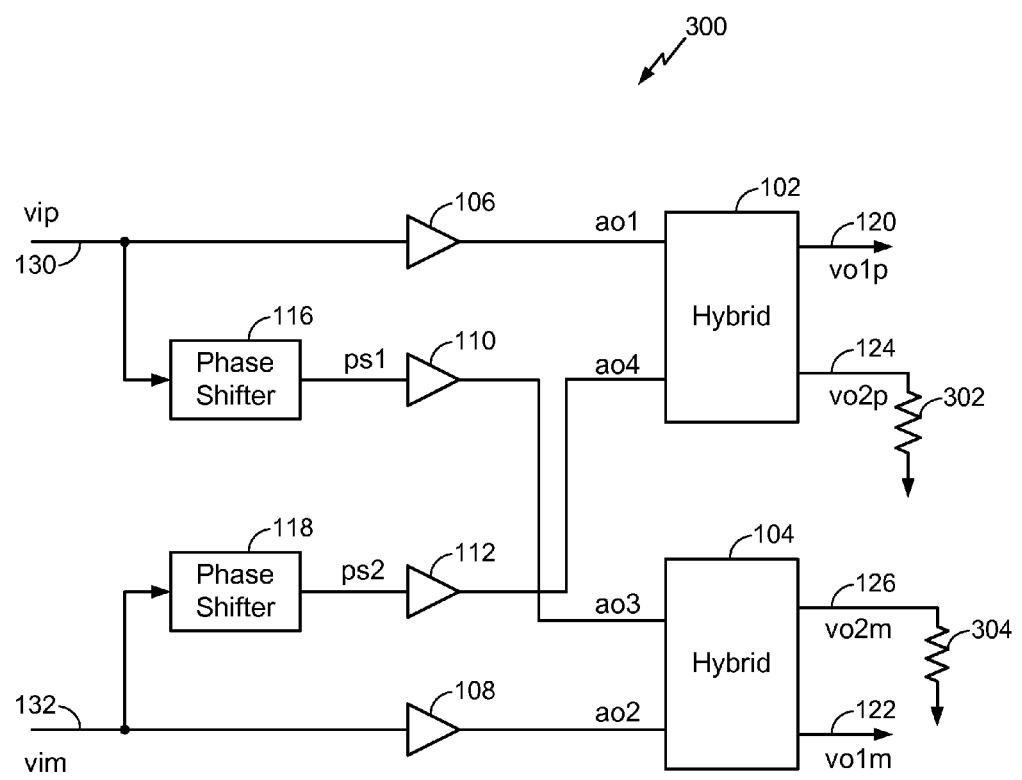
FIG. 3 is a diagram of a particular illustrative embodiment of a system including the device of FIG. 1.

Referring to FIG. 3, a particular embodiment of a system including a device operable to perform harmonic extraction and rejection is depicted and generally designated 300. In a particular embodiment, the system 300 includes the device 100 of FIG. 1, a first termination resistive element 302 and a second termination resistive element 304. To illustrate, the system 300 includes the first hybrid 102 and the second hybrid 104. The system 300 also includes the first amplifier 106, the second amplifier 108, the third amplifier 110, and the fourth amplifier 112. The first amplifier 106 and the fourth amplifier 112 may be coupled to the first hybrid 102. The second amplifier 108 and the third amplifier 110 may be coupled to the second hybrid 104. The system 300 further includes the first phase shifter 116 and the second phase shifter 118. The output of the first phase shifter 116 may be coupled to the input of the third amplifier 110, and the output of the second phase shifter 118 may be coupled to the input of the fourth amplifier 112.

In a particular embodiment, the first amplifier 106, the second amplifier 108, the third amplifier 110, and the fourth amplifier 112 may respectively correspond to the first amplifier 106, the second amplifier 108, the third amplifier 110, and the fourth amplifier 112 of FIG. 1 and may operate in the manner described with respect to FIG. 1. In addition, the first phase shifter 116 and the second phase shifter 118 may respectively correspond to the first phase shifter 116 and the second phase shifter 118 of FIG. 1 and may operate in the manner described with respect to FIG. 1. Further, the first hybrid 102 and the second hybrid 104 may respectively correspond to the first hybrid 102 and the second hybrid 104 of FIG. 1 and may operate in the manner described with respect to FIG. 1.

As described with respect to FIG. 1, the first input line 130 may be coupled to the input of the first amplifier 106 and to the input of the first phase shifter 116. The second input line 132 may be coupled to the input of the second amplifier 108 and to the input of the second phase shifter 118. The output of the first phase shifter 116 may be coupled to the input of the third amplifier 110, and the output of the second phase shifter 118 may be coupled to the input of the fourth amplifier 112.

As described with respect to FIG. 1, the first input of the first hybrid 102 may be coupled to the output of the first amplifier 106, and the second input of the first hybrid 102 may be coupled to the output of the fourth amplifier 112. Similarly, the first input of the second hybrid 104 may be coupled to the output of the second amplifier 108, and the second input of the second hybrid 104 may be coupled to the output of the third amplifier 110.

In a particular embodiment, a first end of the first termination resistive element 302 may be coupled to the second output 124 of the first hybrid 102, and a second end of the first termination resistive element 302 may be coupled to a voltage supply or to ground. Similarly, a first end of the second termination resistive element 304 may be coupled to the second output 126 of the second hybrid 104, and a second end of the second termination resistive element 304 may be coupled to a voltage supply or to the ground. For example, the first termination resistive element 302 may be a resistor that is coupled between the second output 124 of the first hybrid 102 and the ground. The second termination resistive element 304 may be a resistor that is coupled between the second output 126 of the second hybrid 104 and the ground. In a particular embodiment, the first termination resistive element 302 may have a 50 ohm resistance, and the second termination resistive element 304 may have a 50 ohm resistance.

In a particular embodiment, the first termination resistive element 302 may provide a path to the ground for harmonic components that are excluded from the first output signal (vo1p) generated by the first hybrid 102. For example, the first termination resistive element 302 may provide a path to the ground for the second output signal (vo2p) corresponding to the first harmonic component of the differential input signal (vip, vim). To illustrate, the first termination resistive element 302 may provide the path to the ground for the second output signal (vo2p) to enable the first hybrid 102 to generate the first output signal (vo1p) without interference from the second output signal (vo2p). Similarly, the second termination resistive element 304 may provide a path to the ground for harmonic components that are excluded from the first output signal (vo1m) generated by the second hybrid 104. For example, the second termination resistive element 304 may provide a path to the ground for the second output signal (vo2m) corresponding to the first harmonic component of the differential input signal (vip, vim). To illustrate, the second termination resistive element 304 may provide the path to the ground for the second output signal (vo2m) to enable the second hybrid 104 to generate the first output signal (vo1m) without interference from the second output signal (vo2m).

During operation, the system 300 may operate in the manner described with respect to the device 100 of FIG. 1. To illustrate, the first input signal (vip) of the differential input signal (vip, vim) may be provided to the first amplifier 106 and to the first phase shifter 116 via the first input line 130. The second input signal (vim) of the differential input signal (vip, vim) may be provided to the second amplifier 108 and to the second phase shifter 118 via the second input line 132.

The first hybrid 102 may generate the first output signal (vo1p) and the second output signal (vo2p) based on the first signal (ao1) and the fourth signal (ao4) in the manner described with respect to FIG. 1. Similarly, the second hybrid 104 may generate the first output signal (vo1m) and the second output signal (vo2m) based on the second signal (ao2) and the third signal (ao3) in the manner described with respect to FIG. 1.

For example, if the first input signal (vip) and the second input signal (vim) each have a 10 GHz frequency, the first output signal (vo1p) and the first output signal (vo1m) may each have a 30 GHz frequency corresponding to the third harmonic components of the first input signal (vip) and the second input signal (vim). The second output signal (vo2p) and the second output signal (vo2m) may each have a 10 GHz frequency corresponding to the first harmonic components of the first input signal (vip) and the second input signal (vim). The first termination resistive element 302 may provide a path to the ground for the second output signal (vo2p) having the rejected 10 GHz frequency component. Similarly, the second termination resistive element 304 may provide a path to the ground for the second output signal (vo2m) having the rejected 10 GHz frequency component.

By separating the harmonic components of the differential input signal (vip, vim), the first differential output signal (vo1p, vo1m) that has a desired frequency may be generated by extracting a particular harmonic component of the differential input signal (vip, vim). In addition, by separating the harmonic components of the differential input signal (vip, vim), the second differential output signal (vo2p, vo2m) that has a suppressed harmonic component may be generated by rejecting a particular harmonic component of the differential input signal (vip, vim). The second differential output signal (vo2p, vo2m) may be directed to the ground via termination resistive element while the first differential output signal (vo1p, vo1m) have the desired frequency may be available for use.

Although FIG. 3 shows the first termination resistive element 302 and the second termination resistive element 304 as resistors, in other embodiments, the first termination resistive element 302 and the second termination resistive element 304 may be other types of elements that have a desired resistance. In addition, although FIG. 3 shows the first termination resistive element 302 coupled to the second output 124 of the first hybrid 102, in other embodiments, the first termination resistive element 302 may be coupled to the first output 120 of the first hybrid 102 instead of the second output 124. Similarly, although FIG. 3 shows the second termination resistive element 304 coupled to the second output 126 of the second hybrid 104, in other embodiments, the second termination resistive element 304 may be coupled to the first output 122 of the second hybrid 104 instead of the second output 126.

Figure 4:
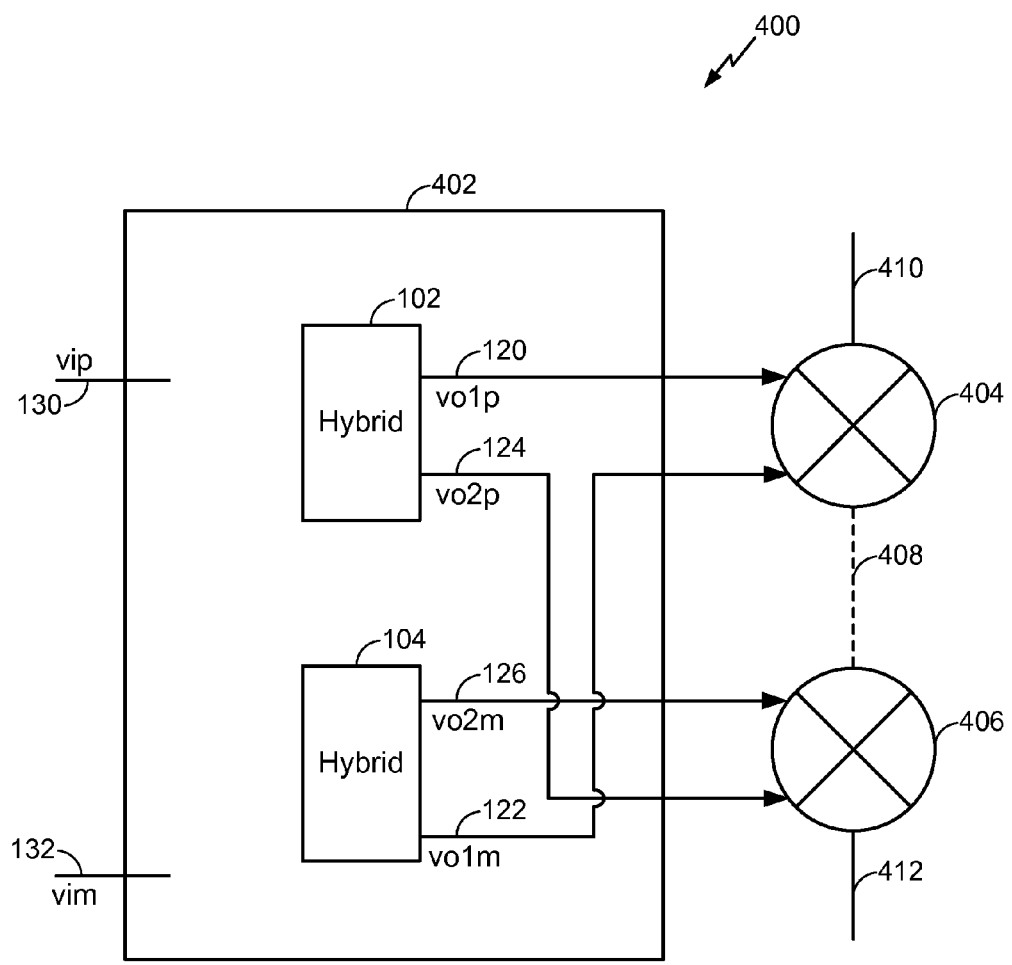
FIG. 4 is a diagram of a particular illustrative embodiment of a system including the device of FIG. 1 and the device of FIG. 2.

Referring to FIG. 4, a particular embodiment of a system including a device operable to perform harmonic extraction and rejection is depicted and generally designated 400. The system 400 includes a device 402, a first mixer circuit 404, and a second mixer circuit 406. The device 402 may be coupled to the first mixer circuit 404 and to the second mixer circuit 406. The first mixer circuit 404 may be coupled to the second mixer circuit 406.

In a particular embodiment, the device 402 may be the device 100 of FIG. 1 or the device 200 of FIG. 2. For example, the first input line 130 may be the first input line 130 of FIGS. 1 and 2, and the second input line 132 may be the second input line 132 of FIGS. 1 and 2. In addition, the first hybrid 102 and the second hybrid 104 may be the first hybrid 102 and the second hybrid 104, respectively, of FIGS. 1 and 2.

In a particular embodiment, the first output 120 of the first hybrid 102 may be coupled to a first local oscillator input of the first mixer circuit 404. For example, the first output signal (vo1p) generated by the first hybrid 102 may be provided to the first local oscillator input of the first mixer circuit 404. Similarly, the first output 122 of the second hybrid 104 may be coupled to a second local oscillator input of the first mixer circuit 404. For example, the first output signal (vo1m) generated by the second hybrid 104 may be provided to the second local oscillator input of the first mixer circuit 404. To illustrate, the first output signal (vo1p) and the first output signal (vo1m) may be provided to the first local oscillator input of the first mixer circuit 404 and to the second local oscillator input of the first mixer circuit 404 as the first differential output signal (vo1p, vo1m).

In a particular embodiment, the second output 124 of the first hybrid 102 may be coupled to a first local oscillator input of the second mixer circuit 406. For example, the second output signal (vo2p) generated by the first hybrid 102 may be provided to the first local oscillator input of the second mixer circuit 406. Similarly, the second output 126 of the second hybrid 104 may be coupled to a second local oscillator input of the second mixer circuit 406. For example, the second output signal (vo2m) generated by the second hybrid 104 may be provided to the second local oscillator input of the second mixer circuit 406. To illustrate, the second output signal (vo2p) and the second output signal (vo2m) may be provided to the first local oscillator input of the second mixer circuit 406 and to the second local oscillator input of the second mixer circuit 406 as the second differential output signal (vo2p, vo2m).

In a particular embodiment, the first mixer circuit 404 may be configured to receive a first mixer input signal on line 410 and to generate a first mixer output signal on line 408. For example, the first mixer circuit 404 may generate the first mixer output signal on line 408 based on the first differential output signal (vo1p, vo1m) and the first mixer input signal on the line 410. For example, the first mixer input signal on the line 410 and the first mixer output signal on the line 408 each may be a differential signal. To illustrate, the first mixer circuit 404 may generate the first mixer output signal such that the first mixer output signal includes a first frequency component and a second frequency component. For example, the first frequency component of the first mixer output signal may correspond to a sum of the frequency of the first mixer input signal on the line 410 and the frequency of the first differential output signal (vo1p, vo1m). The second frequency component of the first mixer output signal may correspond to a difference between the frequency of the first mixer input signal on the line 410 and the frequency of the first differential output signal (vo1p, vo1m).

In a particular embodiment, the device 402 and the first mixer circuit 404 may operate as a sub-harmonic mixer by generating the first mixer output signal on the line 408 that has a frequency (e.g., 45 GHz) that is higher than the frequency (15 GHz) of the differential input signal (vip, vim) provided to the device 402. For example, as described with respect to the device 100 of FIG. 1, the device 402 (which corresponds to the device 100 of FIG. 1) may generate the first differential output signal (vo1p, vo1m) that has a 45 GHz frequency based on the differential input signal (vip, vim) that has a 15 GHz frequency. If the first mixer input signal on the line 410 is a direct current (DC) signal that has a frequency of zero, the first mixer circuit 404 may generate the first mixer output signal on the line 408 such that the first mixer output signal has a frequency of 45 GHZ based on the 45 GHz frequency of the first differential output signal (vo1p, vo1m) and the zero frequency of the first mixer input signal on the line 410.

In a particular embodiment, the second mixer circuit 406 may be configured to receive the first mixer output signal on the line 408 and to generate a second mixer output signal on line 412. For example, the second mixer circuit 406 may generate the second mixer output signal on the line 412 based on the second differential output signal (vo2p, vo2m). To illustrate, the second mixer circuit 406 may generate the second mixer output signal such that the second mixer output signal includes a first frequency component and a second frequency component. For example, the first frequency component of the second mixer output signal may correspond to a sum of the frequency of the first mixer output signal on the line 408 and the frequency of the second differential output signal (vo2p, vo2m). The second frequency component of the second mixer output signal may correspond to a difference between the frequency of the first mixer output signal on the line 408 and the frequency of the second differential output signal (vo2p, vo2m).

During operation, the device 402 may receive the differential input signal (vip, vim) having 15 GHz frequency. To illustrate, the first input signal (vip) and the second input signal (vim) may each have a 15 GHz frequency. As described with respect to the device 100 of FIG. 1, the device 402 may generate the first differential output signal (vo1p, vo1m) having a 45 GHz frequency. The device 402 may also generate the second differential output signal (vo2p, vo2m) having a 15 GHz frequency and a suppressed frequency component at 45 GHz.

The first mixer circuit 404 may receive the first mixer input signal on the line 410 and the first differential output signal (vo1p, vo1m) and generate the first mixer output signal on the line 408. For example, if the first mixer input signal is a DC signal, the first mixer output signal on the line 408 may have a 45 GHz frequency. The second mixer circuit 406 may receive the 45 GHz signal from the first mixer circuit 404 and the second differential output signal (vo2p, vo2m) from the device 402 and generate the second mixer output signal on the line 412. The second mixer output signal may have a 60 GHz frequency based on the 45 GHz frequency of the first mixer output signal on the line 408 and the 15 GHz frequency of the second differential output signal (vo2p, vo2m).

When the device 402 operates as described with respect to the device 200 of FIG. 2, the first differential output signal (vo1p, vo1m) may have a frequency (e.g., 15 GHz) corresponding to the frequency of the differential input signal (vip, vim). The first differential output signal (vo1p, vo1m) may also have a suppressed frequency component at 45 GHz. The second differential output signal (vo2p, vo2m) may have a frequency (e.g., 45 GHz corresponding to the third harmonic component of the differential input signal (vip, vim)). The first mixer circuit 404 and the second mixer circuit 406 may operate in the manner described based on the frequencies of the first differential output signal (vo1p, vo1m) and the second differential output signal (vo2p, vo2m).

By separating the harmonic components of the differential input signal (vip, vim), the first mixer output signal on the line 408 having a desired frequency may be generated. By generating the first mixer output signal on the line 408, the device 402 and the first mixer circuit 404 may operate as a sub-harmonic mixer that receives an input signal (e.g., the differential input signal (vip, vim)) with a first frequency and generates a mixer output signal that has a frequency that is higher than the first frequency. By generating the second mixer output signal on the line 412 based on the first mixer output signal, the system 400 may be used in the generation a radiofrequency (RF) signal based on a baseband signal or an intermediate frequency (IF) signal that may be provided to the first mixer circuit 404 on the line 410.

Although FIG. 4 shows the first mixer circuit 404 and the second mixer circuit 406 coupled to each other via the line 408, in other embodiments, the first mixer output signal on the line 408 may be provide to other system components instead of the second mixer circuit 406. Similarly, the second mixer circuit 406 may receive an input signal (e.g., a baseband signal or an IF signal) from another system component instead of the first mixer circuit 404.

Figure 5:
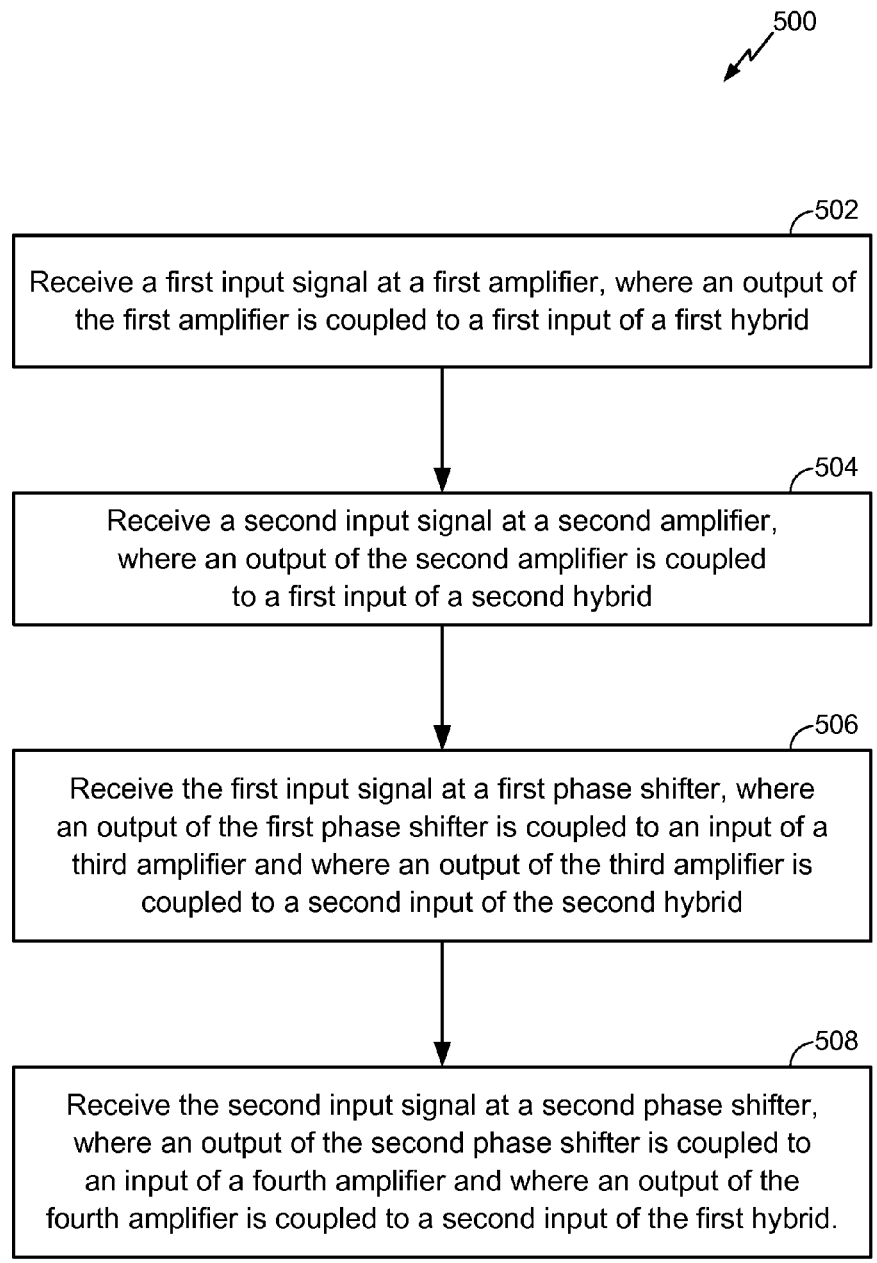
FIG. 5 is a flow chart of a particular illustrative embodiment of a method of operating the device of FIG. 1.

Referring to FIG. 5, a particular illustrative embodiment of a method of performing harmonic extracting and rejection, such as by operation of the device 100 of FIG. 1, is depicted and generally designated 500. The method 500 includes receiving a first input signal at a first amplifier, at 502. For example, the first amplifier 106 of FIG. 1 may receive the first input signal (vip) of the differential input signal (vip, vim) of FIG. 1. An output of the first amplifier may be coupled to a first input of a first hybrid. For example, the output of the first amplifier 106 may be coupled to the first input of the first hybrid 102 of FIG. 1. A second amplifier may receive a second input signal, at 504. For example, the second amplifier 108 of FIG. 1 may receive the second input signal (vim) of the differential input signal (vip, vim) of FIG. 1. An output of the second amplifier may be coupled to a first input of a second hybrid. For example, the output of the second amplifier 108 may be coupled to the first input of the second hybrid 104 of FIG. 1.

The method 500 may include receiving the first input signal at a first phase shifter, at 506. For example, the first phase shifter 116 of FIG. 1 may receive the first input signal (vip) of the differential input signal (vip, vim). An output of the first phase shifter may be coupled to an input of a third amplifier, and an output of the third amplifier is coupled to a second input of the second hybrid. For example, the output of the first phase shifter 116 may be coupled to the input of the third amplifier 110 of FIG. 1. The output of the third amplifier 110 may be coupled to the second input of the second hybrid 104.

A second phase shifter may receive the second input signal, at 508. For example, the second phase shifter 118 of FIG. 1 may receive the second input signal (vim) of the differential input signal (vip, vim). An output of the second phase shifter may be coupled to an input of a fourth amplifier and an output of the fourth amplifier may be coupled to a second input of the first hybrid. For example, the output of the second phase shifter 118 may be coupled to the input of the fourth amplifier 112 of FIG. 1. The output of the fourth amplifier 112 may be coupled to the second input of the first hybrid 102.

The method 500 of FIG. 5 may be implemented by an application-specific integrated circuit (ASIC), a field-programmable gate array (FPGA) device, a processing unit such as a central processing unit (CPU), a digital signal processor (DSP), a controller, another hardware device, a firmware device, or any combination thereof. As an example, the method of FIG. 5 can be performed by or in response to signals or commands from a processor that executes instructions, as described with respect to FIG. 7.

Figure 6:
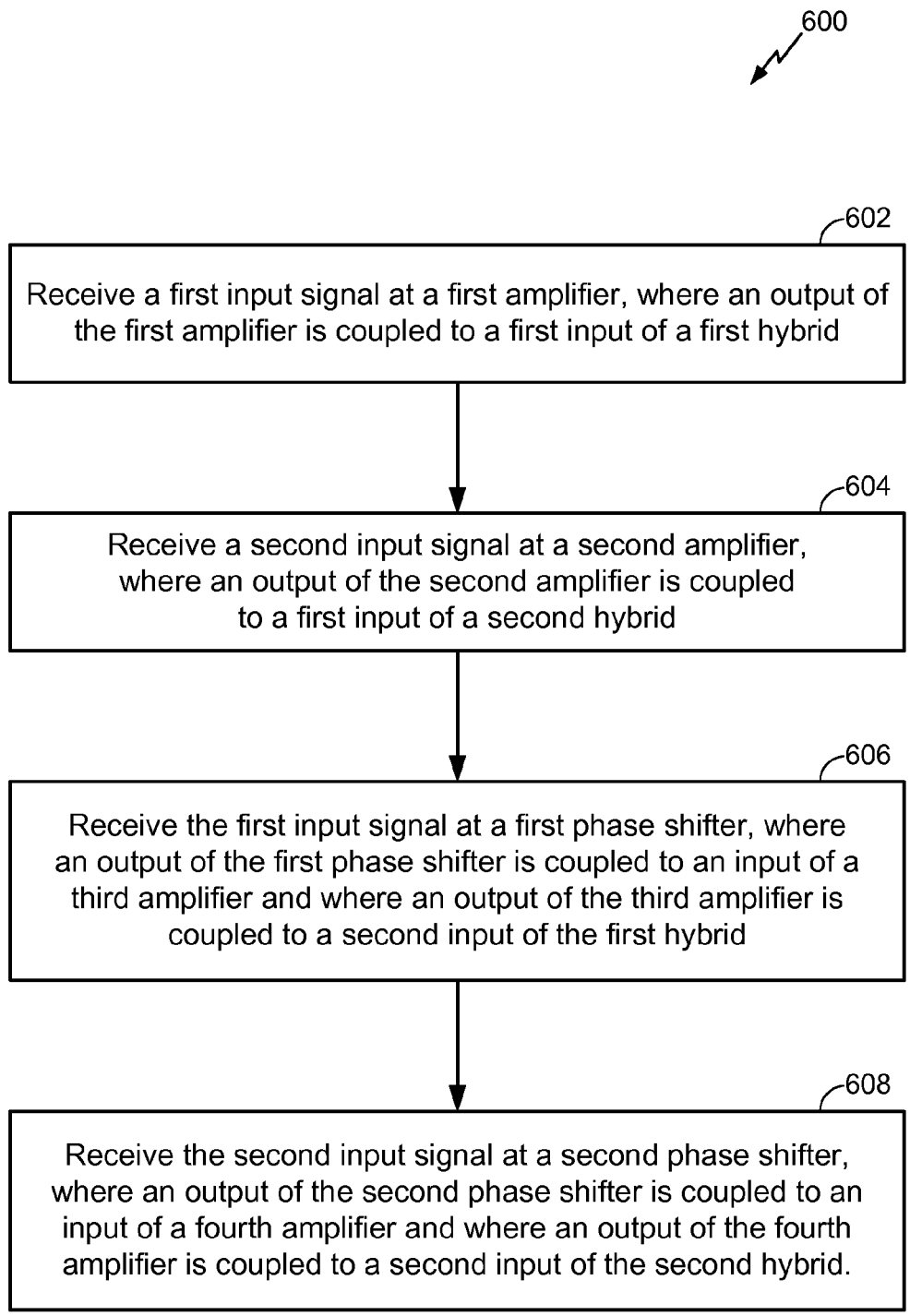
FIG. 6 is a flow chart of a particular illustrative embodiment of a method of operating the device of FIG. 2.

Referring to FIG. 6, a particular illustrative embodiment of a method of performing harmonic extracting and rejection, such as by operation of the device 200 of FIG. 2, is depicted and generally designated 600. The method 600 includes receiving a first input signal at a first amplifier, at 602. For example, the first amplifier 106 of FIG. 2 may receive the first input signal (vip) of the differential input signal (vip, vim) of FIG. 2. An output of the first amplifier may be coupled to a first input of a first hybrid. For example, the output of the first amplifier 106 may be coupled to the first input of the first hybrid 102 of FIG. 2. A second amplifier may receive a second input signal, at 604. For example, the second amplifier 108 of FIG. 2 may receive the second input signal (vim) of the differential input signal (vip, vim) of FIG. 2. An output of the second amplifier may be coupled to a first input of a second hybrid. For example, the output of the second amplifier 108 may be coupled to the first input of the second hybrid 104 of FIG. 2.

The method 600 may include receiving the first input signal at a first phase shifter, at 606. For example, the first phase shifter 116 of FIG. 2 may receive the first input signal (vip) of the differential input signal (vip, vim). An output of the first phase shifter may be coupled to an input of a third amplifier, and an output of the third amplifier may be coupled to a second input of the first hybrid. For example, the output of the first phase shifter 116 may be coupled to the input of the third amplifier 110 of FIG. 2. The output of the third amplifier 110 may be coupled to the second input of the first hybrid 102.

A second phase shifter may receive the second input signal, at 608. For example, the second phase shifter 118 of FIG. 2 may receive the second input signal (vim) of the differential input signal (vip, vim). An output of the second phase shifter may be coupled to an input of a fourth amplifier and an output of the fourth amplifier may be coupled to a second input of the second hybrid. For example, the output of the second phase shifter 118 may be coupled to the input of the fourth amplifier 112 of FIG. 2. The output of the fourth amplifier 112 may be coupled to the second input of the second hybrid 104.

The method 600 of FIG. 6 may be implemented by an application-specific integrated circuit (ASIC), a field-programmable gate array (FPGA) device, a processing unit such as a central processing unit (CPU), a digital signal processor (DSP), a controller, another hardware device, a firmware device, or any combination thereof. As an example, the method of FIG. 6 can be performed by or in response to signals or commands from a processor that executes instructions, as described with respect to FIG. 7.

Figure 7:
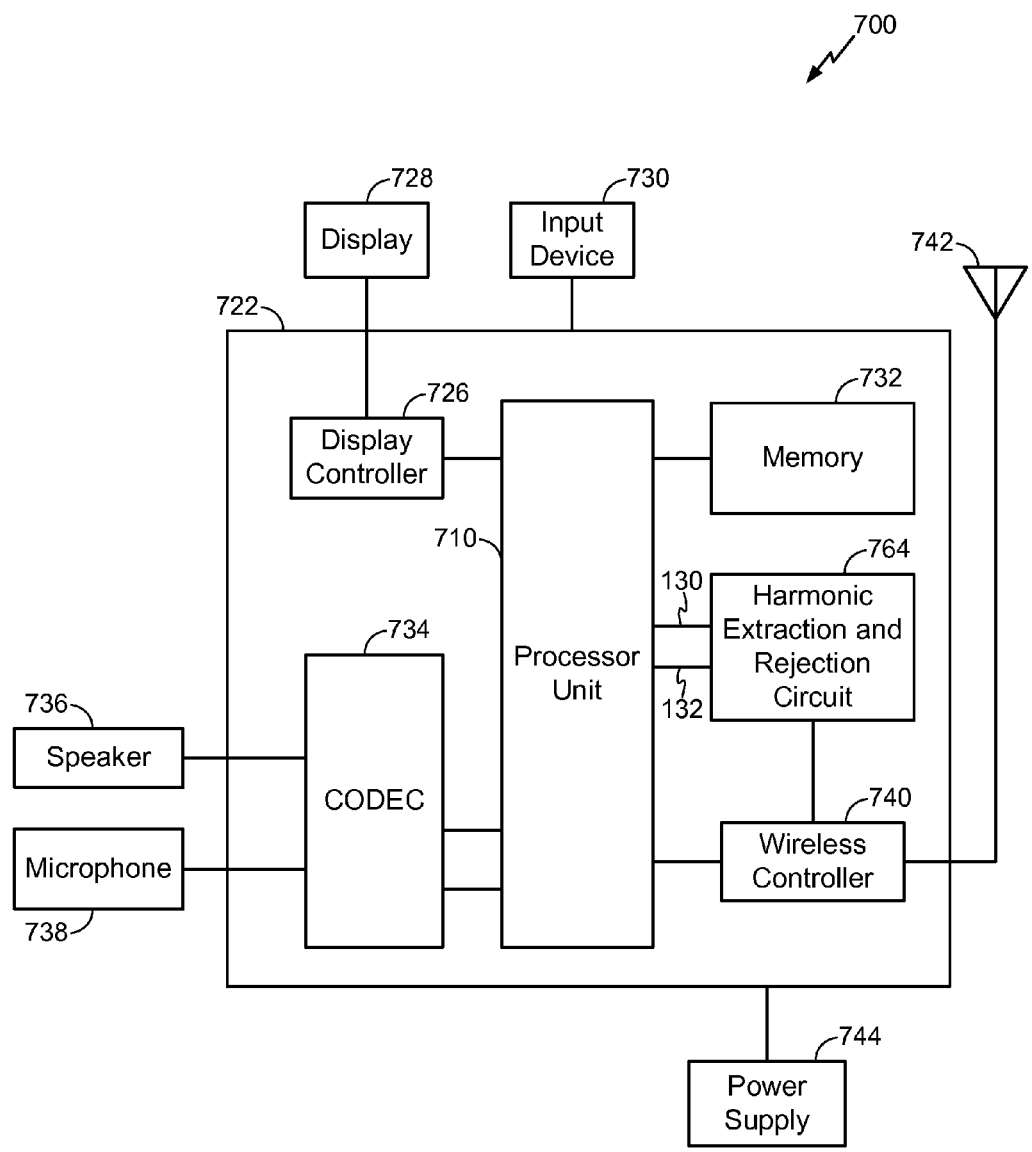
FIG. 7 is a block diagram of a wireless device including a harmonic extraction and rejection circuit.

Referring to FIG. 7, a block diagram of a particular illustrative embodiment of a wireless communication device that includes a harmonic extraction and rejection circuit is depicted and generally designated 700. The wireless communication device 700 includes a processor unit 710, such as a digital signal processor (DSP), coupled to a memory 732. The wireless communication device 700 may include a harmonic extraction and rejection circuit 764. In an illustrative embodiment, the harmonic extraction and rejection circuit 764 may correspond to the device 100 of FIG. 1, the device 200 of FIG. 2, the system 300 of FIG. 3, the device 402 of FIG. 4, or may operate according to the method of FIG. 5, the method of FIG. 6, or any combination thereof.

The memory 732 may be a non-transitory computer readable medium storing program code that is executable by the processor unit 710 (e.g., a computer) to cause the processor unit 710 to provide a first signal via the line 130 and a second signal via the line 132 to the harmonic extraction and rejection circuit 764.

FIG. 7 also shows a display controller 726 that is coupled to the processor unit 710 and to a display 728. A coder/decoder (CODEC) 734 can also be coupled to the processor unit 710. A speaker 736 and a microphone 738 can be coupled to the CODEC 734.

FIG. 7 indicates that a wireless controller 740 can be coupled to the processor unit 710 and to a wireless antenna 742. In a particular embodiment, the processor unit 710, the harmonic extraction and rejection circuit 764, the display controller 726, the memory 732, the CODEC 734, and the wireless controller 740 are included in a system-in-package or system-on-chip device 722. For example, the harmonic extraction and rejection circuit 764 may provide a differential local oscillator signal (e.g., (vo1$p$, vo1$m$) of FIGS. 1, 2, and 3 or (vo2$p$, vo2$m$) of FIGS. 1, 2, and 3) to the wireless controller 740, such that the wireless controller 740 processes signals received via the wireless antenna 742. As another example, the harmonic extraction and rejection circuit 764 may provide a differential local oscillator signal (e.g., (vo1$p$, vo1$m$) of FIGS. 1, 2, and 3 or (vo2$p$, vo2$m$) of FIGS. 1, 2, and 3) to the wireless controller 740, such that the wireless controller 740 processes signals for transmission via the wireless antenna 742. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the wireless antenna 742, and the power supply 744 are external to the system-on-chip device 722. However, each of the display 728, the input device 730, the speaker 736, the microphone 738, the wireless antenna 742, and the power supply 744 can be coupled to a component of the system-on-chip device 722, such as an interface or a controller.

While FIG. 7 illustrates a particular embodiment of a wireless communication device 700, one or more circuits (e.g., the harmonic extraction and rejection circuit 764) may be integrated in other electronic devices including a set top box, a music player, a video player, an entertainment unit, a navigation device, a communications device, a personal digital assistant (PDA), a fixed location data unit, and a computer.

In conjunction with the described embodiments, an apparatus is disclosed that may include first means for generating a first output signal and a second output signal, where the first output signal is phase shifted from the second output signal, where a first input of the first means for generating is coupled to an output of first means for amplifying, and where the first means for amplifying is configured to receive a first input signal. For example, the first means for generating a first output signal and a second output signal may include the first hybrid 102 of FIGS. 1, 3, and 4. The first means for amplifying may include the first amplifier 106 of FIGS. 1 and 3. The apparatus may also include second means for generating a third output signal and a fourth output signal, where the third output signal is phase shifted from the fourth output signal, where a first input of the second means for generating is coupled to an output of second means for amplifying, and where the second means for amplifying is configured to receive a second input signal. For example, the second means for generating a third output signal and a fourth output signal may include the second hybrid 104 of FIGS. 1, 3, and 4. The second means for amplifying may include the second amplifier 108 of FIGS. 1 and 3.

The apparatus may further include first means for phase shifting configured to receive the first input signal, where an output of the first means for phase shifting is coupled to an input of third means for amplifying and where an output of the third means for amplifying is coupled to a second input of the second means for generating. For example, the first means for phase shifting may include the first phase shifter 116 of FIGS. 1 and 3. The third means for amplifying may include the third amplifier 110 of FIGS. 1 and 3. The apparatus may also include second means for phase shifting configured to receive the second input signal, where an output of the second means for phase shifting is coupled to an input of fourth means for amplifying and where an output of the fourth means for amplifying is coupled to a second input of the first means for generating. For example, the second means for phase shifting may include the second phase shifter 118 of FIGS. 1 and 3. The fourth means for amplifying may include the fourth amplifier 112 of FIGS. 1 and 3.

In conjunction with the described embodiments, another apparatus is disclosed that may include first means for generating a first output signal and a second output signal, where the first output signal is phase shifted from the second output signal, where a first input of the first means for generating is coupled to an output of first means for amplifying, and where the first means for amplifying is configured to receive a first input signal. For example, the first means for generating a first output signal and a second output signal may include the first hybrid 102 of FIGS. 2 and 4. The first means for amplifying may include the first amplifier 106 of FIG. 2. The apparatus may also include second means for generating a third output signal and a fourth output signal, where the third output signal is phase shifted from the fourth output signal, where a first input of the second means for generating is coupled to an output of second means for amplifying, and where the second means for amplifying is configured to receive a second input signal. For example, the second means for generating a third output signal and a fourth output signal may include the second hybrid 104 of FIGS. 2 and 4. The second means for amplifying may include the second amplifier 108 of FIG. 2.

The apparatus may further include first means for phase shifting configured to receive the first input signal, where an output of the first means for phase shifting is coupled to an input of third means for amplifying, and where an output of the third means for amplifying is coupled to a second input of the first means for generating. For example, the first means for phase shifting may include the first phase shifter 116 of FIGS. FIG. 2. The third means for amplifying may include the third amplifier 110 of FIGS. FIG. 2. The apparatus may also include second means for phase shifting configured to receive the second input signal, where an output of the second means for phase shifting is coupled to an input of fourth means for amplifying, and where an output of the fourth means for amplifying is coupled to a second input of the second means for generating. For example, the second means for phase shifting may include the second phase shifter 118 of FIG. 2. The fourth means for amplifying may include the fourth amplifier 112 of FIGS. FIG. 2.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
a first hybrid configured to generate a first pair of output signals based on splitting power received via a first pair of input signals, wherein a first input of the first hybrid is coupled to an output of a first amplifier and wherein the first amplifier is configured to receive a first input signal;
a second hybrid configured to generate a second pair of output signals based on splitting power received via a second pair of input signals, wherein a first input of the second hybrid is coupled to an output of a second amplifier and wherein the second amplifier is configured to receive a second input signal;
a first phase shifter having only one single output signal and configured to receive the first input signal and to output the single output signal corresponding to a first phase shifted signal that is phase shifted by a first amount from a phase of the first input signal, wherein an output of the first phase shifter is coupled to an input of a third amplifier, and wherein an output of the third amplifier is coupled to a second input of the second hybrid; and
a second phase shifter configured to receive the second input signal and to output a second phase shifted signal that is phase shifted by a second amount from a phase of the second input signal, wherein an output of the second phase shifter is coupled to an input of a fourth amplifier and wherein an output of the fourth amplifier is coupled to a second input of the first hybrid.

2. The device of claim 1, wherein the first hybrid comprises a first 90-degree hybrid and wherein the second hybrid comprises a second 90-degree hybrid.

3. The device of claim 1, wherein the first amount is approximately 90 degrees.

4. The device of claim 1, wherein the second amount is approximately 90 degrees.

5. The device of claim 1, wherein:
when the first input signal has a 0 degree phase, the first amplifier outputs a first amplified signal including at least one harmonic having a 0 degree phase,
when the first input signal has a 180 degree phase, the first amplifier outputs the first amplified signal including at least one harmonic having a 180 degree phase,
when the second input signal has a 0 degree phase, the second amplifier outputs a second amplified signal including at least one harmonic having a 0 degree phase, and
when the second signal has a 180 degree phase, the second amplifier outputs the second amplified signal including at least one harmonic having a 180 degree phase.

6. The device of claim 1, wherein:
when the first phase shifted signal has a 90 degree phase or a 270 degree phase, the third amplifier outputs a third amplified signal including at least one harmonic having a 90 degree phase and at least one harmonic having a 270 degree phase, and
when the second phase shifted signal has a 90 degree phase or a 270 degree phase, the fourth amplifier outputs a fourth amplified signal including at least one harmonic having a 90 degree phase and at least one harmonic having a 270 degree phase.

7. The device of claim 1, wherein a first output of the first hybrid is coupled to a first local oscillator input of a mixer circuit and wherein a first output of the second hybrid is coupled to a second local oscillator input of the mixer circuit.

8. The device of claim 7, wherein a second output of the first hybrid is coupled to ground potential via a first termination resistor and wherein a second output of the second hybrid is coupled to the ground potential via a second termination resistor.

9. The device of claim 1, wherein a first output signal of the first hybrid corresponds to a third harmonic of the first input signal, wherein a first output signal of the second hybrid corresponds to a third harmonic of the second input signal, wherein a second output signal of the first hybrid corresponds to a first harmonic of the first input signal, and wherein a second output signal of the second hybrid corresponds to a first harmonic of the second input signal.

10. The device of claim 1, wherein a second output of the first hybrid is coupled to a first local oscillator input of a second mixer circuit and wherein a second output of the second hybrid is coupled to a second local oscillator input of the second mixer circuit.

11. The device of claim 10, wherein an output of a first mixer circuit is coupled to an input of the second mixer circuit.

12. The device of claim 1, wherein the second input signal is phase shifted 180 degrees from the first input signal.

13. The device of claim 1, wherein the first amount is different than the second amount.

14. The device of claim 1, further comprising:
a plurality of hybrids including the first hybrid and the second hybrid; and
a plurality of amplifiers including the first amplifier and the second amplifier, wherein each input of each hybrid of the plurality of hybrids is connected to an output of a single corresponding amplifier of the plurality of amplifiers.

15. The device of claim 1, wherein the first input is configured to receive a signal that is output by the first amplifier.

16. A method comprising:
receiving a first input signal at a first amplifier and amplifying the first input signal to generate a first amplified signal, wherein the first amplified signal is output by the first amplifier and received by a first input of a first hybrid;
receiving a second input signal at a second amplifier and amplifying the second input signal to generate a second amplified signal, wherein the second amplified signal is output by the second amplifier and received by a first input of a second hybrid;
receiving the first input signal at a first phase shifter having only one single output signal;

phase shifting, by the first phase shifter, the first input signal to generate the single output signal corresponding to a first phase shifted signal;

outputting, by the first phase shifter, the single output signal corresponding to the first phase shifted signal;

receiving, at an input of a third amplifier, the single output signal corresponding to the first phase shifted signal, wherein an output of the third amplifier is coupled to a second input of the second hybrid;

receiving the second input signal at a second phase shifter;

phase shifting the second input signal to generate a second phase shifted signal;

outputting, by the second phase shifter, the second phase shifted signal; and receiving, at an input of a fourth amplifier, the second phase shifted signal, wherein an output of the fourth amplifier is coupled to a second input of the first hybrid.

17. The method of claim 16, wherein the single output signal corresponding to the first phase shifted signal is phase shifted by a first amount from a phase of the first input signal and wherein the second phase shifted signal is phase shifted by a second amount from a phase of the second input signal.

18. The method of claim 17, wherein the first amount is approximately 90 degrees and wherein the second amount is approximately 90 degrees.

19. The method of claim 16, wherein a first output signal of the first hybrid corresponds to a third harmonic of the first input signal, wherein a first output signal of the second hybrid corresponds to a third harmonic of the second input signal, wherein a second output signal of the first hybrid corresponds to a first harmonic of the first input signal, and wherein a second output signal of the second hybrid corresponds to a first harmonic of the second input signal.

20. The method of claim 19, wherein the first output signal of the first hybrid is provided to a first local oscillator input of a first mixer circuit and wherein the first output signal of the second hybrid is provided to a second local oscillator input of the first mixer circuit.

21. The method of claim 20, wherein the second output signal of the first hybrid is provided to a first local oscillator input of a second mixer circuit and wherein the second output signal of the second hybrid is provided to a second local oscillator input of the second mixer circuit.

22. The method of claim 21, wherein an output signal of the first mixer circuit is provided to the second mixer circuit and wherein the first mixer circuit generates the output signal of the first mixer circuit based on a mixer input signal, the first output signal of the first hybrid and the first output signal of the second hybrid.

23. The method of claim 20, wherein the second output signal of the first hybrid is provided to a first termination resistor coupled to ground and wherein the second output signal of the second hybrid is provided to a second termination resistor coupled to the ground.

24. An apparatus comprising:
first means for generating a first output signal and a second output signal, wherein the first output signal is phase shifted from the second output signal, wherein a first input of the first means for generating is coupled to an output of first means for amplifying, and wherein the first means for amplifying is configured to receive a first input signal;

second means for generating a third output signal and a fourth output signal, wherein the third output signal is phase shifted from the fourth output signal, wherein a first input of the second means for generating is coupled to an output of second means for amplifying, and wherein the second means for amplifying is configured to receive a second input signal;

first means for phase shifting having only one single output signal and configured to receive the first input signal, wherein an output of the first means for phase shifting is coupled to an input of third means for amplifying, wherein an output of the third means for amplifying is coupled to a second input of the second means for generating, and wherein the first means for phase shifting is configured to output the single output signal corresponding to a first phase shifted signal that is phase shifted by a first amount from a phase of the first input signal; and second means for phase shifting configured to receive the second input signal, wherein an output of the second means for phase shifting is coupled to an input of fourth means for amplifying and wherein an output of the fourth means for amplifying is coupled to a second input of the first means for generating.

25. The apparatus of claim 24, wherein the first means for phase shifting is configured to output a first phase shifted signal that is phase shifted by a first amount from a phase of the first input signal and wherein the second means for phase shifting is configured to output a second phase shifted signal that is phase shifted by a second amount from a phase of the second input signal.

26. The apparatus of claim 25, wherein the first amount is approximately 90 degrees and wherein the second amount is approximately 90 degrees.

27. The apparatus of claim 25, wherein a first output signal of the first means for generating corresponds to a third harmonic of the first input signal, wherein a first output signal of the second means for generating corresponds to a third harmonic of the second input signal, wherein a second output signal of the first means for generating corresponds to a first harmonic of the first input signal, and wherein a second output signal of the second means for generating corresponds to a first harmonic of the second input signal.

28. A non-transitory computer-readable medium including instructions, that when executed by a processor, cause the processor to provide signals to a device comprising:
a first hybrid configured to generate a first pair of output signals based on splitting power received via a first pair of input signals, wherein a first input of the first hybrid is coupled to an output of a first amplifier and wherein the first amplifier is configured to receive a first input signal;

a second hybrid configured to generate a second pair of output signals based on splitting power received via a second pair of input signals, wherein a first input of the second hybrid is coupled to an output of a second amplifier and wherein the second amplifier is configured to receive a second input signal;

a first phase shifter having only one single output signal and configured to receive the first input signal and to output the single output signal corresponding to a first phase shifted signal that is phase shifted by a first amount from a phase of the first input signal, wherein an output of the first phase shifter is coupled to an input of a third amplifier, and wherein an output of the third amplifier is coupled to a second input of the second hybrid; and a second phase shifter configured to receive the second input signal and to output a second phase shifted signal that is phase shifted by a second amount from a phase of the second input signal, wherein an output of the second phase shifter is coupled to an input of a fourth amplifier, and wherein an output of the fourth amplifier is coupled to a second input of the first hybrid.

29. A device comprising:
- a first hybrid configured to generate a first pair of output signals based on splitting power received via a first pair of input signals, wherein a first input of the first hybrid is coupled to an output of a first amplifier, and wherein the first amplifier is configured to receive a first input signal;
- a second hybrid configured to generate a second pair of output signals based on splitting power received via a second pair of input signals, wherein a first input of the second hybrid is coupled to an output of a second amplifier, and wherein the second amplifier is configured to receive a second input signal;
- a first phase shifter configured to receive the first input signal and to output a first phase shifted signal that is phase shifted by a first amount from a phase of the first input signal, wherein an output of the first phase shifter is coupled to an input of a third amplifier, and wherein an output of the third amplifier is coupled to a second input of the second hybrid; and
- a second phase shifter configured to receive the second input signal and to output a second phase shifted signal that is phase shifted by a second amount from a phase of the second input signal, wherein an output of the second phase shifter is coupled to an input of a fourth amplifier, wherein an output of the fourth amplifier is coupled to a second input of the first hybrid, and wherein the first amount is different than the second amount.

30. The device of claim 29, wherein the first hybrid comprises a first 90-degree hybrid and wherein the second hybrid comprises a second 90-degree hybrid.

31. The device of claim 29, wherein the first amount is approximately 90 degrees.

32. The device of claim 29, wherein the second amount is approximately 90 degrees.

33. The device of claim 29, wherein:
- when the first input signal has a 0 degree phase, the first amplifier outputs a first amplified signal including at least one harmonic having a 0 degree phase,
- when the first input signal has a 180 degree phase, the first amplifier outputs the first amplified signal including at least one harmonic having a 180 degree phase,
- when the second input signal has a 0 degree phase, the second amplifier outputs a second amplified signal including at least one harmonic having a 0 degree phase, and
- when the second signal has a 180 degree phase, the second amplifier outputs the second amplified signal including at least one harmonic having a 180 degree phase.

34. The device of claim 29, wherein:
- when the first phase shifted signal has a 90 degree phase or a 270 degree phase, the third amplifier outputs a third amplified signal including at least one harmonic having a 90 degree phase and at least one harmonic having a 270 degree phase, and
- when the second phase shifted signal has a 90 degree phase or a 270 degree phase, the fourth amplifier outputs a fourth amplified signal including at least one harmonic having a 90 degree phase and at least one harmonic having a 270 degree phase.

35. The device of claim 29, wherein a first output of the first hybrid is coupled to a first local oscillator input of a mixer circuit and wherein a first output of the second hybrid is coupled to a second local oscillator input of the mixer circuit.

36. A device comprising:
- a plurality of amplifiers including a first amplifier, a second amplifier, a third amplifier, and a fourth amplifier, wherein the first amplifier is configured to receive a first input signal and the second amplifier is configured to receive a second input signal;
- a plurality of hybrids including a first hybrid and a second hybrid, wherein the first hybrid is configured to generate a first pair of output signals based on splitting power received via a first pair of input signals, wherein a first input of the first hybrid is coupled to an output of the first amplifier, wherein the second hybrid is configured to generate a second pair of output signals based on splitting power received via a second pair of input signals, wherein a first input of the second hybrid is coupled to an output of the second amplifier, and wherein each input of each hybrid of the plurality of hybrids is connected to an output of a single corresponding amplifier of the plurality of amplifiers;
- a first phase shifter configured to receive the first input signal and to output a first phase shifted signal that is phase shifted by a first amount from a phase of the first input signal, wherein an output of the first phase shifter is coupled to an input of the third amplifier, and wherein an output of the third amplifier is coupled to a second input of the second hybrid; and
- a second phase shifter configured to receive the second input signal and to output a second phase shifted signal that is phase shifted by a second amount from a phase of the second input signal, wherein an output of the second phase shifter is coupled to an input of the fourth amplifier and wherein an output of the fourth amplifier is coupled to a second input of the first hybrid.

37. The device of claim 36, wherein the first hybrid comprises a first 90-degree hybrid and wherein the second hybrid comprises a second 90-degree hybrid.

38. The device of claim 36, wherein:
- when the first input signal has a 0 degree phase, the first amplifier outputs a first amplified signal including at least one harmonic having a 0 degree phase,
- when the first input signal has a 180 degree phase, the first amplifier outputs the first amplified signal including at least one harmonic having a 180 degree phase,
- when the second input signal has a 0 degree phase, the second amplifier outputs a second amplified signal including at least one harmonic having a 0 degree phase, and
- when the second signal has a 180 degree phase, the second amplifier outputs the second amplified signal including at least one harmonic having a 180 degree phase.

39. A device comprising:
- first means for generating a first output signal and a second output signal, wherein the first output signal is phase shifted from the second output signal, wherein a first input of the first means for generating is coupled to an output of first means for amplifying, and wherein the first means for amplifying is configured to receive a first input signal;
- second means for generating a third output signal and a fourth output signal, wherein the third output signal is phase shifted from the fourth output signal, wherein a first input of the second means for generating is coupled to an output of second means for amplifying, and wherein the second means for amplifying is configured to receive a second input signal;
- first means for phase shifting configured to receive the first input signal, wherein an output of the first means for phase shifting is coupled to an input of third means for amplifying, wherein an output of the third means for amplifying is coupled to a second input of the second means for generating, and wherein the first means for phase shifting is configured to output a first phase shifted signal that is phase shifted by a first amount from a phase of the first input signal; and second means for phase shifting configured to receive the second input signal, wherein an output of the second means for phase shifting is coupled to an input of fourth means for amplifying and wherein an output of the fourth means for amplifying is coupled to a second input of the first means for generating, wherein the second means for phase shifting is configured to output a second phase shifted signal that is phase shifted by a second amount from a phase of the second input signal, and wherein the first amount is different than the second amount.

40. The device of claim 39, wherein a first output signal of the first means for generating corresponds to a third harmonic of the first input signal, wherein a first output signal of the second means for generating corresponds to a third harmonic of the second input signal, wherein a second output signal of the first means for generating corresponds to a first harmonic of the first input signal, and wherein a second output signal of the second means for generating corresponds to a first harmonic of the second input signal.

41. A non-transitory computer-readable medium including instructions, that when executed by a processor, cause the processor to provide signals to a device comprising:

a first hybrid configured to generate a first pair of output signals based on splitting power received via a first pair of input signals, wherein a first input of the first hybrid is coupled to an output of a first amplifier and wherein the first amplifier is configured to receive a first input signal;

a second hybrid configured to generate a second pair of output signals based on splitting power received via a second pair of input signals, wherein a first input of the second hybrid is coupled to an output of a second amplifier and wherein the second amplifier is configured to receive a second input signal;

a first phase shifter configured to receive the first input signal and to output a first phase shifted signal that is phase shifted by a first amount from a phase of the first input signal, wherein an output of the first phase shifter is coupled to an input of a third amplifier, and wherein an output of the third amplifier is coupled to a second input of the second hybrid; and a second phase shifter configured to receive the second input signal and to output a second phase shifted signal that is phase shifted by a second amount from a phase of the second input signal, wherein an output of the second phase shifter is coupled to an input of a fourth amplifier, and wherein an output of the fourth amplifier is coupled to a second input of the first hybrid, wherein the first amount is different than the second amount.

42. The non-transitory computer-readable medium of claim 41, wherein the first amount is approximately 90 degrees.

43. The non-transitory computer-readable medium of claim 41, wherein the second amount is approximately 90 degrees.

* * * * *